United States Patent [19]
Laming et al.

[11] Patent Number: 5,930,435
[45] Date of Patent: Jul. 27, 1999

[54] OPTICAL FILTER DEVICE

[75] Inventors: Richard I. Laming; Wei–Hung Loh; David N. Payne; Michael N. Zervas, all of Southampton, United Kingdom

[73] Assignee: University of Southampton, Hampshire, United Kingdom

[21] Appl. No.: 08/737,985

[22] PCT Filed: May 19, 1995

[86] PCT No.: PCT/GB95/01141

§ 371 Date: May 1, 1997

§ 102(e) Date: May 1, 1997

[87] PCT Pub. No.: WO95/32451

PCT Pub. Date: Nov. 30, 1995

[30] Foreign Application Priority Data

May 19, 1994 [GB] United Kingdom .................. 9410065
Feb. 24, 1995 [GB] United Kingdom .................. 9503781

[51] Int. Cl.[6] .................................................... G02B 6/02
[52] U.S. Cl. ........................... 385/126; 358/37; 358/28; 358/50
[58] Field of Search ............................. 385/126, 37, 27, 385/28, 30, 39, 50

[56] References Cited

U.S. PATENT DOCUMENTS

| 4,531,811 | 7/1985 | Hicks, Jr. ..................... 385/126 X |
| 5,550,940 | 8/1996 | Vengsarkar et al. ................. 385/28 |

FOREIGN PATENT DOCUMENTS

| 0262438 A2 | 4/1988 | European Pat. Off. . |
| 0417441 A1 | 3/1991 | European Pat. Off. . |
| 0498945 A3 | 11/1991 | European Pat. Off. . |
| 0566236 A1 | 3/1993 | European Pat. Off. . |

OTHER PUBLICATIONS

D. M. Bird et al., "Narrow Line Semiconductor Laser Using Fibre Grating," Electronics Letters, vol. 27, No. 13, pp. 1115–1116, Jun. 20, 1991.

S. J. Frisken, "Transient Bragg Reflection Gratings In Erbium–Doped Fiber Amplifiers," Optics Letters, vol. 17, No. 24, pp. 1776–1778, Dec. 15, 1992.

M. Horowitz et al., "Narrow–Linewidth, Singlemode Erbium–Doped Fibre Laser With Intracavity Wave Mixing In Saturable Absorber," Electronics Letters, vol. 30, No. 8, pp. 648–649, Apr. 14, 1994.

Y. Cheng et al., "Stable Single–Frequency Traveling–Wave Fiber Loop Laser With Integral Saturable–Absorber–Based Tracking Narrow–Band Filter," Optics Letters, vol. 20, No. 8, pp. 875–877, Apr. 15, 1995.

Primary Examiner—Phan T. H. Palmer
Attorney, Agent, or Firm—Renner, Otto, Boisselle & Sklar, PLL

[57] ABSTRACT

Passive, self-adjusting and tracking optical wavelength filters are described. The filters are absorptive and can be of either transmissive or reflective type. The filters comprise an unpumped doped optical waveguide configured so that signals of different wavelength are spatially decoupled to some extent. The self-adjustment of the filter centre wavelength is achieved by the combined effects of the power-dependent saturable absorption, provided by an appropriate dopant, and partial longitudinal hole burning provided by the spatial decoupling of the different wavelengths. External cavity lasers using this type of filter in the external cavity are also described. This external cavity configuration can provide stable single frequency operation of, for example, a semiconductor laser. By using a saturable absorber for the external cavity (e.g. an erbium doped fibre), longitudinal mode-hopping can be suppressed, ensuring single frequency operation.

25 Claims, 28 Drawing Sheets

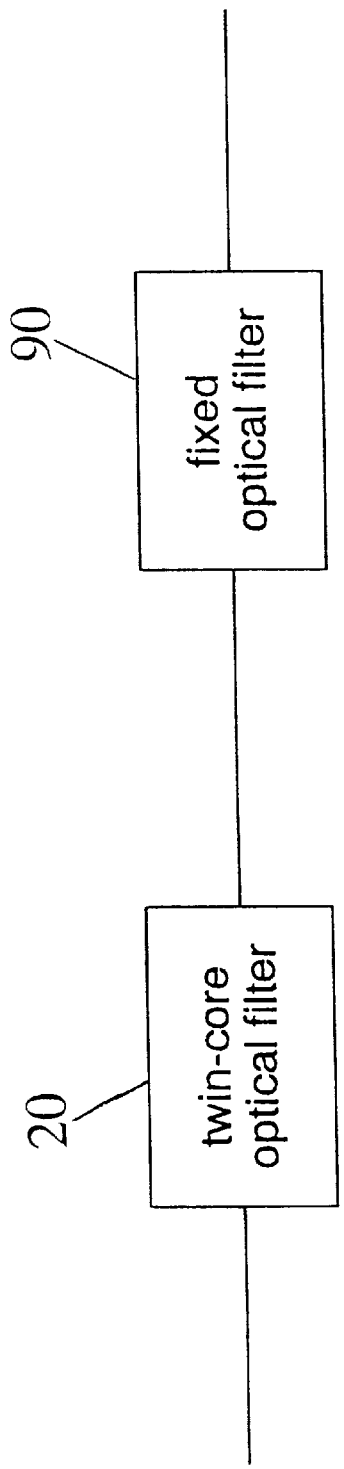
Fig. 18(a)
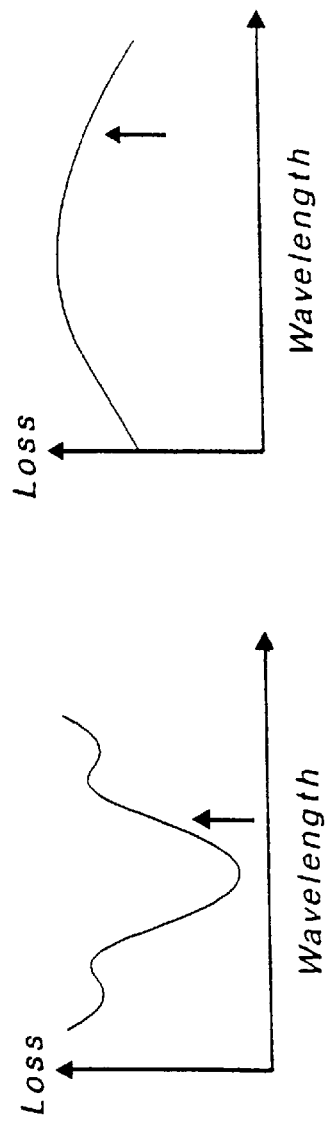
Fig. 18(b)
Fig. 18(c)

OPTICAL FILTER DEVICE

BACKGROUND OF THE INVENTION

This invention relates to optical devices such as, for example, optical filters or external cavity lasers.

Optical filters arc generally passive optical elements having a wavelength dependent transmission characteristic.

It is known to construct optical filters using dual-core, substantially lossless optical fibres. Dual-core fibres, as the name suggests, are optical fibrers having two cores in close proximity. Light injected into one core cross-couples periodically into the adjacent core via evanescent field interaction. The cross-coupling strength and the power evolution in each core depend on the geometrical parameters of the fibre such as the core size and core-to-core separation, the optical parameters of the fibre such as the fibre numerical aperture (NA) and cutoff wavelength, and the optical wavelength in use.

In previous optical filters using dual core optical fibres, an optical signal is launched in one of the cores (the input) and emerges from the same or the adjacent core (the output) depending on the length of the fibre used in the filter. Filtering is achieved by the wavelength dependence of the coupling between the two fibres, denoted by the coupling coefficient $C_S$.

Considering each input signal separately, the optical power in that signal is periodically transferred between the two cores of a dual-core optical fibre. In fact, the transfer of power between the two cores follows a substantially sinusoidal pattern, oscillating between a peak where all or most of the power is in one core, and a peak of opposite polarity where all or most of the power is in the other core. The period of this oscillation (the cross-coupling beat length) is of the order of a few millimeters (mm).

At any point along the dual core fibre, therefore, the relative proportions of the input light in each of the two fibres depends on the current phase of the periodic transfer of light of that wavelength. By selecting a fibre of a particular length, the transfer phase of light of one wavelength can be selected so that the light of that wavelength is substantially all in one core, with light of another (undesired) wavelength being all in the other core. The filter output is taken from only one core (the core in which the desired wavelength is at a maximum at the end of the filter).

Fibre filters of this type are very sensitive to environmental variations, since their operation depends heavily on the fibre length and the phasing of the transfer between the two cores.

SUMMARY OF THE INVENTION

This invention provides an optical filter for filtering a first optical signal from a second optical signal, the first and second optical signals having different wavelengths and intensities, the filter comprising:

a saturable optical absorber, the first signal intensity causing a greater saturation of the absorber than the second signal intensity;

the arrangement being such that, in operation, the first optical signal and the second optical signal propagate in the waveguide to form respective spatial intensity distributions dependent on the wavelength of each signal.

The wavelength dependence of the spatial intensity distributions means that peak intensities in the waveguide of two signals of different wavelengths do not always coincide. The second optical signal is of an insufficient optical power to saturate the absorber on its own, and will instead be attenuated at each point along each core by an amount dependent on the saturation caused by the other (more powerful) signal. This means that at positions along the fibre where the intensity distributions of the two signals are in phase, the core absorption is saturated by the first (more powerful) signal and the second (less powerful) signal is only slightly attenuated. However, where the two signals do not coincide spatially, the second signal will be attenuated much more strongly by the unsaturated absorber at those positions.

In other words, the loss sustained by the second (weaker) signal after passing through the filter is greater than the loss sustained by the first (stronger) signal. This wavelength and power dependent loss gives rise to the filtering effect provided by the filter.

The skilled man will appreciate that the first and second optical signals could in fact cover respective ranges of wavelengths. For example, the first optical signal might be a modulated carrier carrying digital or analogue information, and the second optical signal could be a broadband background noise signal. Similarly, it will be appreciated that the filter could be used with a number of more and less intense signals at different wavelengths. Each signal which is sufficiently intense to at least partially saturate the absorber would generate a respective filter response around that signal's wavelength as described above.

In order to achieve the saturable absorbing properties, it is preferred that the waveguide is doped with a rare earth dopant. Preferably the dopant is erbium or praseodymium.

Although the waveguide could be, for example, a planar optical waveguide, it is preferred that the waveguide is an optical fibre, such as a silica optical fibre.

In one preferred embodiment, the optical fibre is a multi-core optical fibre having a plurality of cores, and, in operation, the first and second signals are launched into a subset of the plurality of cores.

This embodiment makes use of the property of dual-core or multi-core fibres described above, in that when two signals of slightly different wavelengths are launched into the fibre, the power of each signal varies periodically along the two fibre cores with slightly different periods. The signal powers of the two input signals thus evolve in- and out-of-phase along each core. In this way, the wavelength dependent intensity distributions referred to earlier are set up.

Although fibres with more than two cores could be employed, it is preferred that the optical fibre is a dual-core optical fibre having two cores. Alternatively, a triple core optical fibre could be used, having three cores axially disposed side-by-side in a row. One of the cores (e.g. a central core) could be undoped.

Preferably the length of the optical fibre is between about 100 and about 10000 times a cross-coupling beat length of the first signal.

Although it would be possible to use light from only one of the cores as an output signal from the filter, this could mean that the filter output depends heavily on the length of the fibre (as in the previous dual-core filters described above) and so on environmental conditions. The filter characteristics can be made less sensitive to the fibre length by employing means for combining light propagating in the plurality of cores of the optical fibre to generate an output optical signal. In contrast to the previously proposed filters described above, the filtering effect is then not heavily dependent on the precise length of the filter, nor on environmental conditions.

In order that the filter output is compatible with, and can easily be spliced to, commonly used single mode optical fibres, it is preferred that the combining means comprises a tapered portion of the optical fibre.

Preferably, in the case of a doped optical fibre waveguide, the dopant is predominantly in the core or cores and has a concentration of between about $10^{22}$ and about $10^{26}$ ions per cubic meter.

In an alternative embodiment, the optical fibre is terminated at one end by an optical reflector, whereby at least a portion of light propagating along the optical fibre towards the reflector is reflected back along the optical fibre in a direction away from the reflector.

This embodiment relies on the wavelength dependence of a standing-wave pattern formed by incoming and reflected light to partially separate the various wavelengths. The period of the standing wave is equal to half of the optical wavelength, so the period will be different for slightly different wavelengths. When two or more optical signals of different powers are launched into the filter, the more powerful signal will saturate certain regions of the waveguide at the peaks of its standing wave pattern. However, the peaks of the standing wave patterns formed by the other, weaker, signal(s) will not fully coincide with the regions of saturated absorber, and so the loss sustained by the weaker signal(s) will be greater than that sustained by the stronger signal.

Although multimode fibres could be used, it is preferred that the filter should be compatible with single mode fibre commonly used in communication systems. To this end, it is preferred that the optical fibre is a single mode optical fibre. In particular, it is preferred that the optical fibre is a so-called "low phonon energy" gallium-lanthanum-sulphur optical fibre.

Preferably the length of the optical fibre is between about 100 and 10000 times the wavelength of the first signal in the optical fibre.

Near to the reflector, the first and second signals tend to generate intensity distributions which are substantially in phase, so the differential gain between the two signals is low. It is preferred therefore that the filter comprises a portion of substantially non-saturable absorbing optical fibre adjacent to the reflector, connected to a portion of saturable absorbing optical fibre. The absorption of the non-saturable fibre can be made lower than that of the saturable fibre, so decreasing the insertion loss of the filter.

In one preferred embodiment, the optical reflector is a mirror. In another preferred embodiment, the optical reflector is a Bragg reflector.

In the filter using a reflector, the input and output of the filter are at the same end of the fibre. In order to allow light to be input and output conveniently, one preferred embodiment employs an optical circulator, connected to an end of the optical fibre opposite to the reflector, the optical circulator having at least: a first port for receiving the first and second optical signals; a second port connected to the optical fibre for transmitting light received at the first port to the optical fibre and for receiving light from the optical fibre; and a third port for supplying light received at the second port as an output signal.

Alternatively, another preferred embodiment employs an optical fibre coupler, the optical fibre coupler having at least: a first port for receiving the first and second optical signals; a-second port connected to the optical fibre for transmitting at least a portion of light received at the first port to the optical fibre and for receiving light from the optical fibre; and a third port for supplying at least a portion of light received at the second port as an output signal.

Various coupling ratios could be used, but it is preferred that the coupler is a substantially 50:50 coupler.

Preferably the coupler has at least a fourth port connected to a second optical fibre for transmitting at least a portion of light received at the first port to the second optical fibre and for receiving light from the optical fibre; and the third port is operable to supply at least a portion of light received at the fourth port as an output signal. In this case, owing to a half-wave phase shift associated with the cross-coupling at the fibre coupling region, light reflected from the filters can interfere constructively and can thus appear substantially entirely in the third port. At the first port used to receive incoming light, however, the interference is destructive and there is practically no reflected light. Also, this arrangement has the advantage that light from both output ports of the coupler is used in a filtering operation.

Viewed from a second aspect this invention provides optical filtering apparatus for filtering a first optical signal from a second optical signal, the first and second optical signals having different wavelengths and intensities, the optical filtering apparatus comprising:

an optical limiting amplifier for amplifying the first and second optical signals;

a filter as defined above for filtering the amplified first optical signal and the amplified second optical signal, the amplified first optical signal causing greater saturation of the absorber than the amplified second optical signal.

Viewed from a third aspect this invention provides optical filtering apparatus for filtering a first optical signal from a second optical signal, the optical filtering apparatus comprising a filter as defined above connected in series with a broadband fixed optical filter.

Viewed from a fourth aspect this invention provides an optical isolator for attenuating an optical signal propagating into the isolator, the isolator comprising:

a saturable optical absorber; and means for directing a control optical signal into the absorber in an opposite propagation direction to that of the signal to be attenuated, the control optical signal having an intensity sufficient to at least partially saturate the absorber;

the arrangement being such that the control optical signal forms a wavelength dependent spatial intensity distribution in the absorber.

Viewed from a fifth aspect this invention provides a method of optically filtering a first optical signal from a second optical signal, the first and second optical signals having different wavelengths and intensities, the method comprising the steps of:

directing the first optical signal and the second optical signal into a saturable optical absorber, the first signal intensity causing a greater saturation of the absorber than the second signal intensity; such that the first optical signal and the second optical signal propagate in the waveguide to form respective spatial intensity distributions dependent on the wavelength of each signal.

External cavity semiconductor lasers have long been considered an attractive way to achieve narrow linewidth single frequency operation, as the linewidth is expected to vary inversely as the square of the cavity length (see publication reference 1 below). In this regard, single mode fibres have often been employed as the basis of the external cavity (see references 2 to 6 below), as they offer a low loss, compact and reasonably robust wave of forming long cavity lengths. It will be appreciated that the term "external" merely means that the external cavity is external to the lasing element (e.g. a semiconductor laser).

To achieve stable single frequency operation, however, a frequency selective element is normally required to discriminate against other external cavity (EC) modes to prevent those modes from lasing. With cavity lengths of a few tens of centimeters or longer, the mode spacings come down to the order of several hundred megahertz (MHz) or less, and it has been difficult so far to find suitable frequency selective elements with sufficient resolution capable of supporting lasing in a single EC mode while suppressing neighbouring EC modes.

Accordingly, this invention also provides an external cavity laser comprising:

a lasing element;

a non-lasing external cavity waveguide coupled to the lasing element, in which the optical absorption of at least a portion of the cavity waveguide is saturable for light in a saturation wavelength band; and a wavelength selective element for promoting lasing operation at a wavelength within the saturation wavelength band.

The invention provides a simple but elegant solution to the problem of supporting single mode operation in an external cavity laser. The solution involves the counter-intuitive step of deliberately introducing loss into the external cavity by using a saturably absorbing external cavity rather than a conventional low-loss external cavity. The saturably absorbing external cavity can stabilise the operation of the lasing element, providing single mode operation with mode-hopping being much reduced or eliminated. The physical basis behind the stabilising effect of the saturably absorbing cavity can be accounted for as follows. When single frequency operation is established in the laser, the resulting intensity standing wave formed in the cavity imposes a spatial hole-burning pattern (loss saturation) on the saturable absorber. Thus, within the external cavity waveguide, regions of high optical intensity coincide with regions of low (saturated) loss, and vice versa. This tends to promote the mode which has become established, but since the standing wave patterns for other modes do not coincide with the regions of saturated absorption caused by the established mode, those other modes experience a higher loss and are therefore suppressed.

This arrangement can allow for a steady frequency drift without mode hopping, since the optical filtering effect of the external cavity waveguide is generated by the established mode itself causing spatial hole-burning. This means that if the frequency of the established mode drifts slightly (over a time scale greater than the lifetime of the saturable absorbing effect) then the pass band of the filter provided by the external cavity will follow that drift.

The wavelength selective element ensures that lasing occurs at cavity modes falling within the saturable absorbing band of the cavity waveguide, rather than avoiding the absorbing band altogether. In other words, the need for a wavelength selective element to select a single one of the EC modes has been removed. All that the wavelength selective element has to do is to ensure that lasing takes place within the saturable absorbing band of the external cavity; the hole-burning effect described above will then operate to select a single mode for lasing operation.

Although the wavelength selective element could be fabricated as, for example, a part of the lasing element structure, it is preferred that the wavelength selective element and the lasing element are disposed at opposite ends of the cavity waveguide. Similarly, although fixed response filters or the like could be used, it is preferred that the wavelength selective element is a wavelength selective reflector. Preferably the wavelength selective reflector is a Bragg reflector.

It is preferred that the lasing element is a semiconductor laser.

In embodiments using relatively short lasing elements such as a semiconductor laser, the gain portion of the laser is kept short and is situated at one end of the laser cavity. This ensures that modes close to the lasing frequency will all have essentially the same standing wave intensity pattern within the gain medium (since at the end reflector of the lasing element, all standing wave patterns are forced to terminate in a node). Thus, neighbouring modes will be unable to take advantage of any excess (unsaturated) gain resulting from spatial hole burning in the gain medium, which could otherwise be potentially destabilising to the single frequency operation of the laser. Although modes sufficiently far away from the original lasing frequency will be able to experience excess gain, they can be prevented from lasing by suitably restricting the bandwidth of the wavelength selective element such that they suffer little feedback. The bandwidth required to achieve this is inversely proportional to the length of the gain element (in fact, as a rule of thumb, the wavelength bandwidth of the frequency selective element should be less than about $\lambda^2/4L$, where $\lambda$ is the lasing wavelength and L is the length of the gain element). Where the gain element is a small fraction of the total cavity length (e.g. when the lasing element is a semiconductor laser), the bandwidth of the wavelength selective element can be broad enough to contain a number of EC modes without penalty to the stability of the single mode operation of the laser.

Accordingly, in these embodiments, the purpose of the wavelength selective element is now two-fold: it ensures that lasing takes place within the saturable absorbing band of the external cavity so that the hole-burning effect in the external cavity (described above) can then operate to select a single EC mode for lasing operation; and it can provide advantageous additional stability by preventing modes far away from the lasing frequency from taking advantage of any excess unsaturated gain in the gain medium and destabilising the laser.

Although the waveguide could be, for example, a planar optical waveguide, it is preferred that the waveguide is an optical fibre, such as a silica optical fibre.

Preferably at least the portion of the cavity waveguide is doped with a saturable absorbing dopant. Various dopants could be used, but it is preferred that the dopant is a rare earth dopant. Although other rare earths such as praseodymium could be used, in a preferred embodiment the dopant is erbium.

BRIEF DESCRIPTION OF THE DRAWINGS

The invention will now be described by way of example with reference to the accompanying drawings, throughout which like parts are referred to by like references, and in which:

FIG. 18(a) is a schematic diagram illustrating a dual-core fibre filter cascaded with a standard fixed broadband filter;

FIG. 18(b) is a schematic graph of the response of the dual-core fibre filter of FIG. 18(a);

FIG. 18(c) is a schematic graph of the response of the broadband filter of FIG. 18(a);

DETAILED DESCRIPTION

Figure 1A:
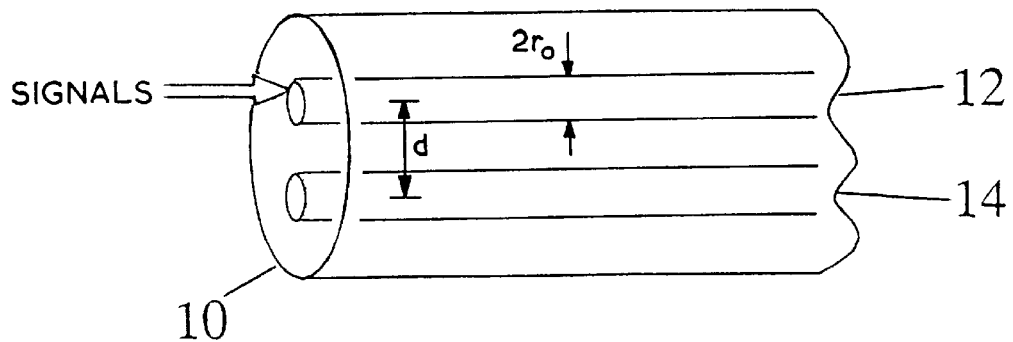
FIG. 1(a) is a schematic diagram illustrating a basic configuration of a dual-core fibre filter.

FIG. 1(a) is a schematic diagram illustrating a basic configuration of a dual-core (twin-core) fibre filter. The filter 10 comprises a length of dual-core fibre (e.g. a single mode silica fibre), with both cores 12, 14 doped with an appropriate dopant.

An optical signal is launched into one of the cores (the input core 12) and the light coming out from both cores is used as output.

Figure 1B:
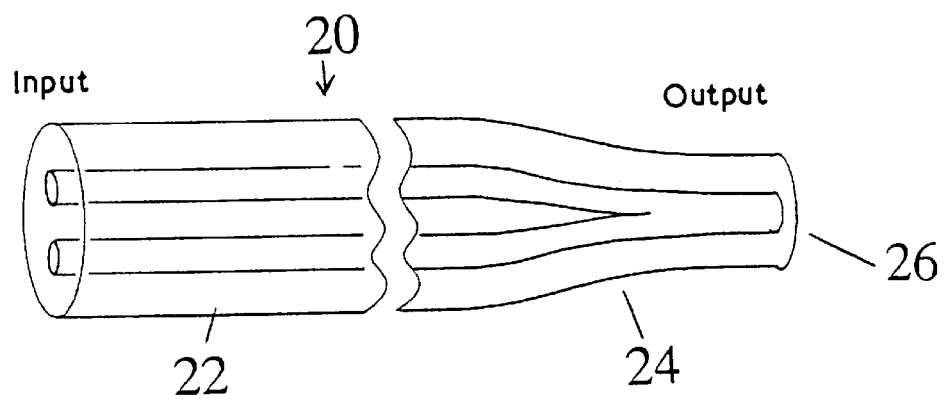
FIG. 1(b) is a schematic diagram illustrating a modified version of the filter of FIG. 1(a), having a tapered output.

FIG. 1(b) shows a modified version 20 of the filter in FIG. 1(a) which is compatible with and facilitates splicing in single-mode fibre systems. The filter comprises a dual-core section 22, which is similar to the filter shown in FIG. 1(a), followed by a tapered section 24. Either core of the dual-core section 22 of the filter 22 can be used as an input port, while the output of the filter is at the end 26 of the tapered section 24. The tapered section 24 provides a quasi-Gaussian output which is substantially insensitive to environmental (e.g. pressure and temperature) changes. The end 26 of the tapered section 24 is also suitable for splicing to single-mode fibre networks. The tapering does, however, contribute an additional insertion loss of about 3 dB (decibels), compared with the basic configuration of FIG. 1(a), due to the leakage of the anti-symmetric eigenmode of the tapered section.

Figure 1C:
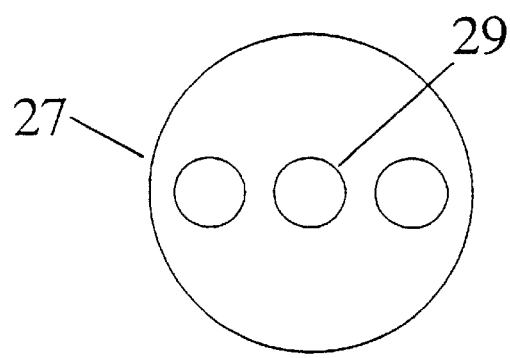
FIG. 1(c) is a schematic diagram showing a triple-core optical fibre in cross section.

FIG. 1(c) shows a further possible arrangement in which a triple core optical fibre 27 comprises three cores, the axes of which are substantially side-by-side in a row. The output of the three cores can be combined by a tapered section to form a filtered output. One of the cores (e.g. a central core 29) need not be doped. Light can be launched into one or two of the cores at the filter input.

The filters 10, 20 are based on a different physical principle compared to previously proposed configurations using dual-core fibres. In addition, the filters 10, 20 are un-pumped devices and, therefore, provide no gain. In other words, they are predominantly absorptive devices. (In fact some relatively trivial pumping may be taking place, but this is not the primary effect by which the filters operate).

The principle of operation of the filters 10, 20 will now be explained for the case of two input signals of different wavelengths and input powers.

The filters 10, 20 provide a filtering action and also a self-adjustment action by a combination of two physical effects. These two effects are the periodic coupling of input light between the two cores of a dual-core optical fibre, and the fact that the absorption provided by some doped optical fibres may be 'saturated' in dependence on the optical power passing through the fibre. The periodic coupling of light between the two cores will be described first.

Considering each input signal separately, the optical power in that signal is periodically transferred between the two cores of a dual-core optical fibre. In fact, the transfer of power between the two cores follows a substantially sinusoidal pattern, oscillating between a peak where all or most of the power is in one core, and a peak of opposite polarity where all or most of the power is in the other core.

An important fact influencing the operation of the filters 10, 20 is that the period of the sinusoidal variation described above (i.e. the length of optical fibre between adjacent peaks of the same polarity) depends on the wavelength of the input light. This means that when two signals of slightly different wavelengths are launched into the filter 10 or the filter 20, the power of each signal varies sinusoidally along the two fibre cores with slightly different periods.

The signal powers of the two input signals evolve in- and out-of-phase periodically along each core. In other words, there is a beating effect between the two sinusoidal power variations. The beating effect has a spatial period representing the length of fibre between adjacent positions at which the two sinusoidal variations are in phase. This spatial period will be referred to as the 'characteristic length' ($L_{ch}$) and is given by the function:

$$L_{ch} = \pi / |C_{S1} - C_{S2}|$$

where $C_{S1}$ and $C_{S2}$ are the coupling coefficients of the two optical signals respectively. Alternatively, the length of the filter could be defined as between about 100 and about 10000 times the cross coupling beat length of the predominant (first) signal.

Figure 2A:
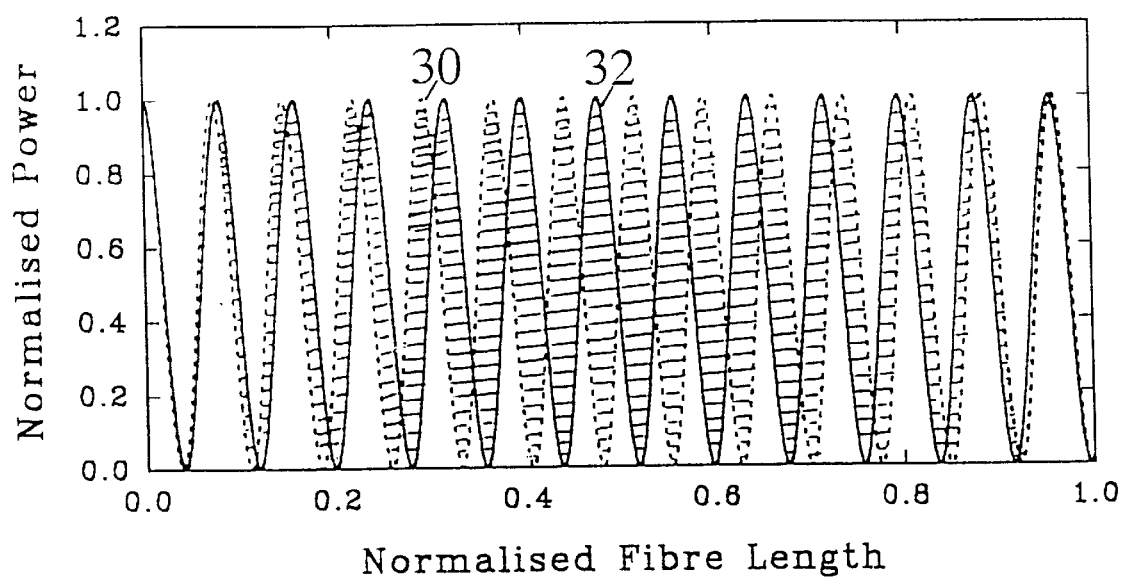
FIG. 2(a) is a schematic graph illustrating the power variation of two optical signals of slightly different wavelengths along an undoped dual-core optical fibre.

FIG. 2(a) is a schematic graph illustrating the power variation of two optical signals of slightly different wavelengths along one core of an undoped dual-core optical fibre. The two signals are represented on the graph by broken (dashed) and solid curves 30, 32 respectively.

In FIG. 2(a), the two signals start in phase at the left hand side of the graph. Each signal then undergoes a series of cycles of sinusoidal power transfer between the two cores of the dual-core fibre. Because the respective periods of the sinusoidal power transfer of the two signals are different (owing to the different wavelengths of the two signals), the power transfers of the two signals move in and out of phase with each other. This effect is referred to as spatial decoupling of the two signals, and is represented schematically in FIG. 2(a) by shading applied to non-common areas of the two curves 30, 32.

The second effect on which the filters rely is a power-dependent saturable absorption provided by the fibre dopant.

The absorption of each core of the doped dual-core optical fibre used in the filters 10, 20 varies at each point along each core in dependence on the optical power carried by that core at that point. This variation of absorption with optical power is illustrated schematically in FIG. 2(b), which is a graph of absorption (or loss) against optical power in a doped optical fibre core.

Figure 2B:
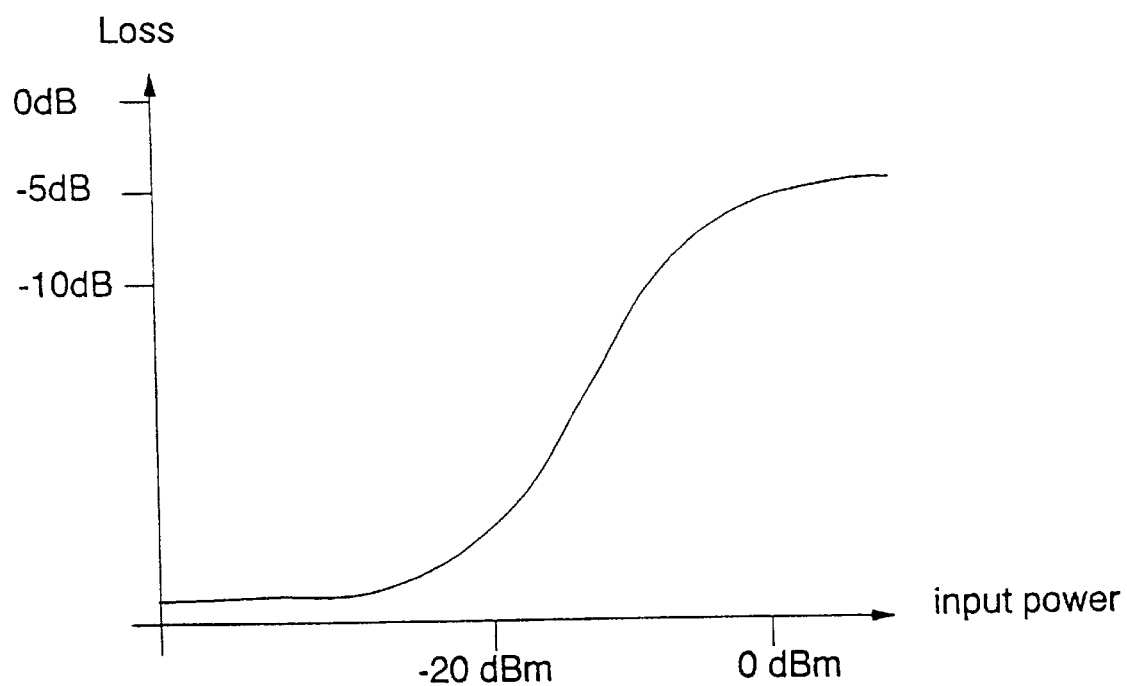
FIG. 2(b) is a graph of absorption against optical power in a doped optical fibre core.

As shown in FIG. 2(b), at low optical powers the fibre core has a high absorption. As the optical power reaches a threshold, which in this example is about −20 dBm (dB relative to 1 milliwatt), the absorption starts to decrease with increasing optical power. Finally, above a second threshold optical power (about 0 dBm in FIG. 2(b)), the absorption is effectively bleached and remains substantially constant at a low value.

The saturation effects described above are localised, so that if adjacent portions of a fibre core carry different optical powers, those adjacent portions may exhibit different saturations and have different absorptions.

Therefore, if the filter 10, 20 is used with one input signal which is sufficiently strong to saturate the absorption of the fibre cores (i.e. having a power near to or above the second threshold value referred to above), that signal will be attenuated only by the relatively small saturated absorption of the cores. (In the example shown in FIG. 2(b), the saturated absorption is only about 5 dB.) However, because of the sinusoidal power transfer between the two cores of the filter 10, 20, this first (stronger) signal saturates the core absorption only at certain regions of each core. These regions are where the first signal has a peak intensity in that core.

As shown in FIG. 2(a), the peak intensities in each core of two signals of different wavelengths do not always coincide, but instead exhibit a spatial beating effect. If the second optical signal launched into the filter 10, 20 is of a lower initial optical power (well below the second threshold power) then that signal will not be sufficiently powerful to saturate the absorber on its own and will instead be attenuated at each point along each core by an amount dependent on the saturation caused by the other (more powerful) signal. This means that at positions along the fibre where the sinusoidal power transfers of the two signals are in phase (such as positions shown at the left and right extremes of FIG. 2(a)), the core absorption is saturated by the first (more powerful) signal and the second (less powerful) signal is only slightly attenuated. However, where the two signals do not coincide spatially (e.g. towards the center of FIG. 2(a)), the second signal will be attenuated much more strongly by the unsaturated absorber at those positions.

In other words, the loss sustained by the second (weaker) signal after passing through the filter is greater than the loss sustained by the first (stronger) signal. This wavelength dependent loss gives rise to the filtering effect provided by the filter.

Figure 2C:
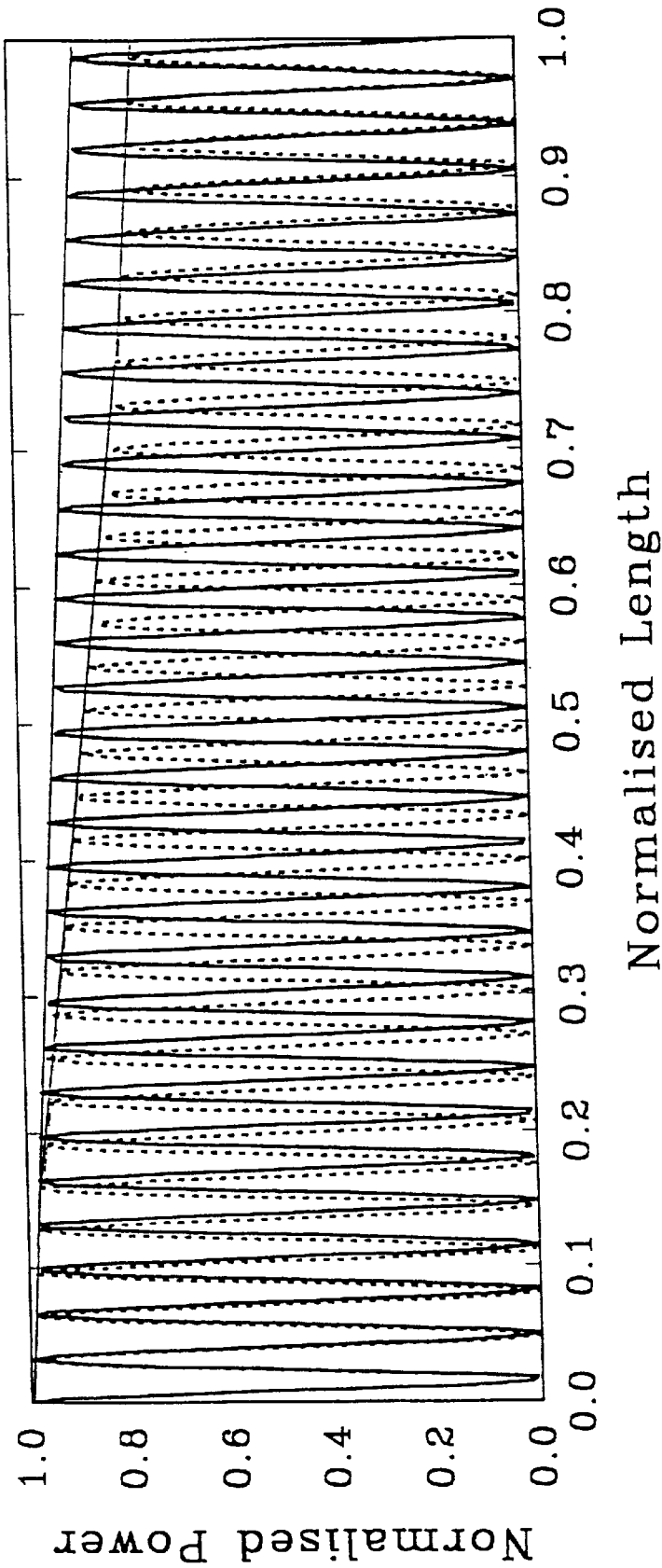
FIG. 2(c) is a graph of the power evolution of two optical signals along one core of the filter of FIG. 1(b)

FIG. 2(c) is a graph of the power evolution of the two optical signals along one core of the filter of FIG. 1(b). In FIG. 2(c), the wavelength difference between the first and second optical signals is different to the difference represented by FIG. 2(a).

In FIG. 2(c), the more powerful signal (solid line) and the less powerful signal (dashed line) have wavelengths 1.555 $\mu$m (micrometres) and 1.565 $\mu$m, and input powers 0 dBm and —20 dBm, respectively. However, for clarity of the diagram, all the powers are normalised to their input counterparts, the fibre length is normalised to $L_{ch}$ and the core-to-core separation is normalised to the core radius.

As shown in FIG. 2(c), along roughly the first and last quarter of $L_{ch}$ the two signals are essentially in phase. The dc-phasing effect and signal spatial separation takes place predominantly over the central half of $L_{ch}$. In the middle of $L_{ch}$ the two channels are in anti-phase and are totally spatially de-coupled, and so in this region the absorption of the second (less powerful) signal is greatest.

The loss rate in decibels per meter (dB/m) of the stronger signal is effectively constant over the entire characteristic length, and is substantially equal to the saturated absorption of the doped fibre cores. However, the loss rate of the weaker signal varies along $L_{ch}$, and is highest along the central half where, as mentioned before, the spatial decoupling between the two signals is the greatest. Along the first and last quarter of the characteristic length, where the signals are essentially in phase, the loss rate is smaller and is almost equal to the loss rate of the stronger signal.

In practice, the filters 10, 20 may be shorter than one characteristic length for the intended optical signals, or may be many characteristic lengths long (e.g. from 0.5 to 10 times the characteristic length long). The graphs described above refer to a length of one characteristic length only to assist in explanation of the principle of operation of the filters.

Figure 3A:
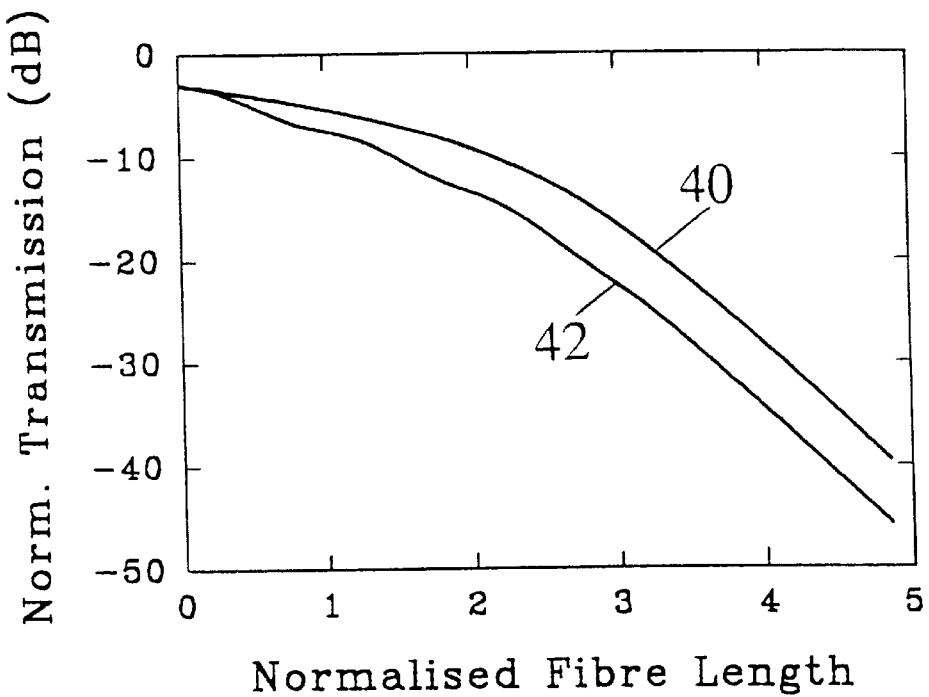
FIG. 3(a) is a graph of the normalised transmission of two optical signals launched into the filter of FIG. 1(b), as a function of normalised fibre length.

FIG. 3(a) is a graph of the normalised transmission of two optical signals launched into the filter 20 of FIG. 1(b), as a function of normalised fibre length. The fibre and signal parameters are listed in Table I below.

TABLE I

| Fibre Parameters | | Optical Parameters | |
|---|---|---|---|
| Numerical aperture | 0.3 | Wavelength of stronger signal | 1555 nm |
| Cutoff wavelength | 835 nm | Input power of stronger signal | 0 dBm |
| Core radius | 1065 nm | Wavelength difference between stronger and weaker signals | 1.5 nm |
| Normalised intercore separation | 10 | Input power of weaker signal | −20 dBm |
| | | Absorption cross-section | 3.3 × $10^{-25}$m$^2$ |
| | | Emission cross-section | 4.7 × $10^{-25}$m$^2$ |

The parameters listed in Table I are typical parameters used as an example to demonstrate the characteristics of the filter 20.

Figure 3B:
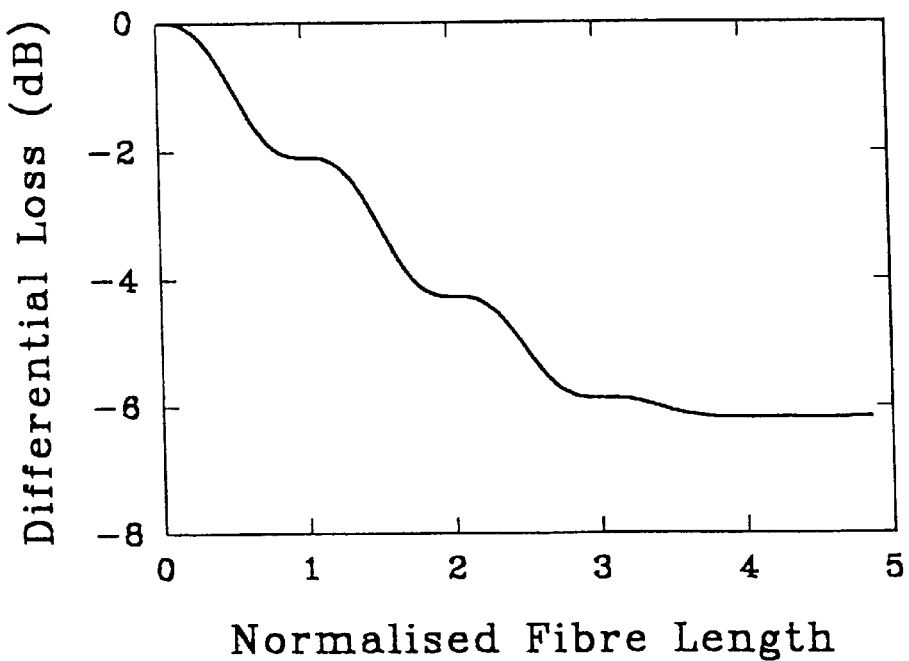
FIG. 3(b) is a graph of the differential losses of two optical signals launched into the filter of FIG. 1(b), as a function of normalised fibre length.

FIG. 3(a) provides two curves 40, 42, for the stronger signal (the curve 40) and the weaker signal (the curve 42) respectively. The normalised transmission of the stronger signal (the curve 40) is a measure of the device insertion loss. The 3dB tapering loss described above is included in FIG. 3(a). The difference between the loss suffered by the two signals provides the filtering effect of the filter 20, and is referred to as the differential loss or extinction ratio of the filter. FIG. 3(b) is a graph of the differential loss of two optical signals as a function of normalised fibre length.

From FIGS. 3(a) and 3(b), it can be seen that the extinction ratio increases with the device length at the expense of increased insertion loss. It is also evident that the extinction ratio increases step-wise in a non-uniform manner. As expected, each step increment is completed along a length equal to the characteristic length, which for the current parameters is 1.648 m. It is also reconfirmed, in agreement with FIG. 2(c), that the first and last quarter of each characteristic length contribute negligibly to the extinction ratio and that the main filtering action takes place at the central half of $L_{ch}$.

The extinction ratio step-increments become progressively smaller with the fibre length as both signals are progressively attenuated. Also, the filter effectiveness (ie extinction ratio) reduces with increasing filter length. For long fibre lengths, the differential loss acquires a constant value as both signal are strongly attenuated and hardly saturate the doped core medium.

Figure 4A:
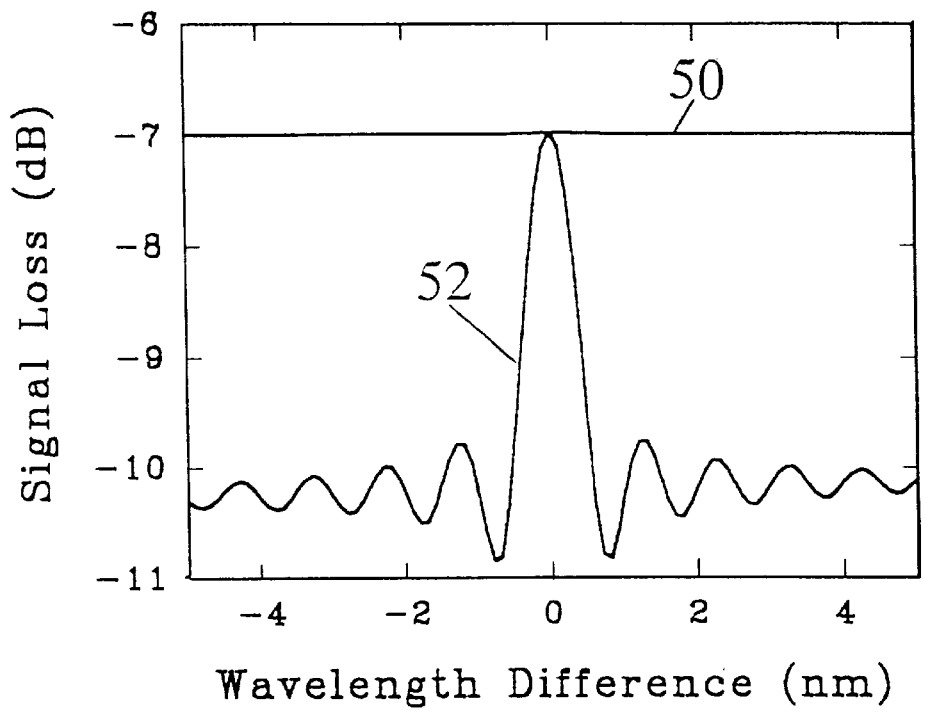
FIG. 4(a) is a graph illustrating the individual signal losses of two signals launched into the filter of FIG. 1(b), as a function of the wavelength difference between the two signals.

FIG. 4(a) is a graph illustrating the individual signal losses of two signals launched into the filter of FIG. 1(b), as a function of the wavelength difference between the two signals. The loss of the stronger signal is represented by a curve 50 and the loss of the weaker signal is represented by a curve 52. Similarly, FIG. 4(b) is a graph illustrating the differential signal losses of two signals launched into the filter of FIG. 1(b), again as a function of the wavelength difference between the two signals.

In FIG. 4(a), the loss of the weaker signal changes significantly as its wavelength difference from the stronger varies. As expected, for very small wavelength differences the weaker signal's loss approaches that of the stronger signal. In this case, the two signals are in quasi-phase throughout the fibre length (or equivalently, $L_{ch}>>L_{EDF}$, where $L_{EDF}$ is the total fibre length) and the wavelength decoupling is negligible. As the wavelength difference increases, the loss of the weaker signal increases until it reaches a maximum. The maximum loss occurs at the wavelength difference that corresponds to a value of $L_{ch}\tilde{}$ (approximately equal to) $\frac{1}{3}L_{EDF}$. At this point, the wavelength decoupling is maximum. For larger wavelength differences, the weaker signal's loss undulates around a mean value. This is a direct result of the variation of the effective wavelength decoupling with wavelength. On the other hand, the loss of the stronger signal (which, as already mentioned, is a measure of the device insertion loss), is effectively constant with the wavelength variation of the weaker signal.

Figure 4B:
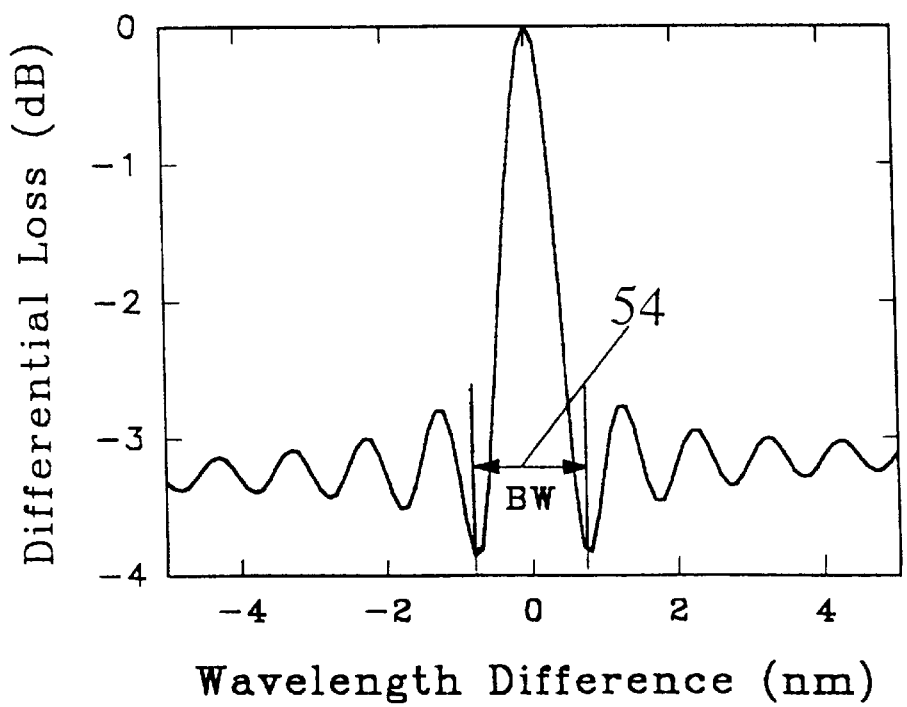
FIG. 4(b) is a graph illustrating the differential signal losses of two signals launched into the filter of FIG. 1(b), as a function of the wavelength difference between the two signals.

In FIG. 4(b), the differential loss (or extinction ratio) experienced by the two signals is plotted against the wavelength difference. It is shown that the filter 20 exhibits the characteristics of a bandpass filter. The bandwidth 54 of the filter is considered here to be the wavelength interval spanning the points of maximum extinction ratio. Thus, the bandwidth is related to the characteristic fibre length and is, therefore, determined by the fibre parameters, i.e. the actual fibre length and the core-to-core separation.

Figure 5A:
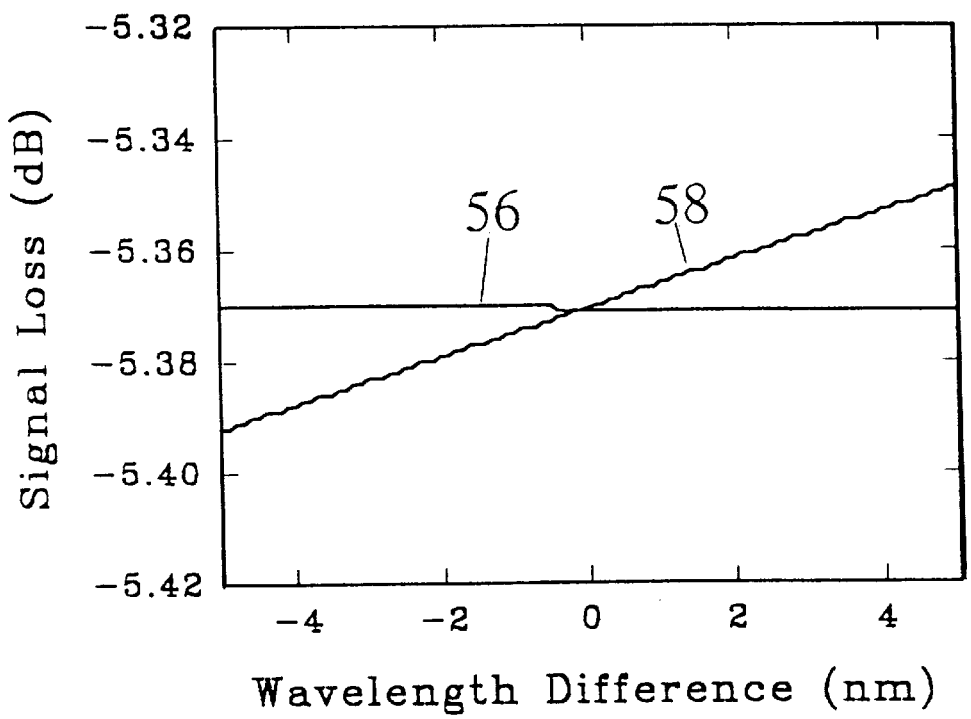
FIG. 5(a) is a graph illustrating the individual signal losses for two signals launched into a single-core doped optical fibre.

For comparison with FIGS. 4(a) and 4(b), FIG. 5(a) is a graph illustrating the individual signal losses for two signals launched into a single-core doped optical fibre. The loss of the stronger signal is represented by a curve 56 and the loss of the weaker signal is represented by a curve 58. Similarly, FIG. 5(*b*) is a graph illustrating the differential signal losses for two signals launched into a single-core doped optical fibre.

Figure 5B:
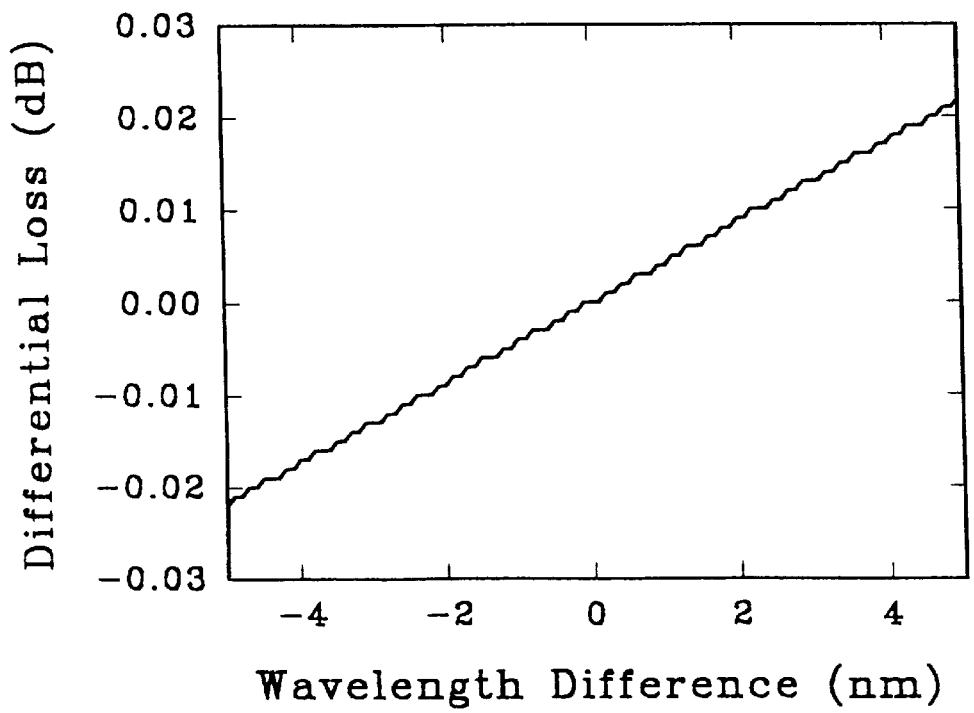
FIG. 5(b) is a graph illustrating the differential signal losses for two signals launched into a single-core doped optical fibre.

In FIG. 5(*a*), the signal losses are smaller than those in FIG. 4(*a*). This is because the power intensity in the core is higher since the same total power is now propagating in a single core. The two signals saturate uniformly and their losses remain comparable (to within 0.04 dB) for the entire wavelength span. This is due to the fact that the active medium (dopant) is considered to be homogeneously broadened. The loss of the stronger signal remains substantially constant, although in fact it does decrease very slightly with the wavelength of signal. A marked difference is, however, observed in the loss experienced by the weaker signal, as compared with the dual-core case (see FIG. 4(*a*)).

For wavelengths $\lambda_2 < \lambda_1$ (i.e., $\Delta\lambda < 0$, where $\lambda_1$ is the wavelength of the stronger signal, $\lambda_2$ is the wavelength of the weaker signal and $\Delta\lambda$ is the difference between the two wavelengths), the weaker signal appears to act as a pump to the stronger signal, lowering slightly the loss of the stronger signal at the expense, of course, of the weaker signal's power. As expected, the situation is reversed when $\lambda_2 > \lambda_1$ ($\Delta\lambda > 0$). As a result, the loss of the weaker signal. as well as the differential loss, increases monotonically by a small amount (~0.04 dB) (see FIG. 5(*b*)).

From FIGS. 4(*a*) and 4(*b*), it is clear that the filter response is passively shaped around the wavelength of the stronger signal. This fact is further demonstrated in FIG. 6, where the extinction ratio of the filter is plotted as a function of the wavelength of the weaker signal, for three wavelengths of the stronger signal: 1.553 μm (curve 60), 1.555 μm (curve 62) and 1.557 μm (curve 64). The rest of the parameters are similar to those applicable to FIGS. 4(*a*) and 4(*b*).

Figure 6:
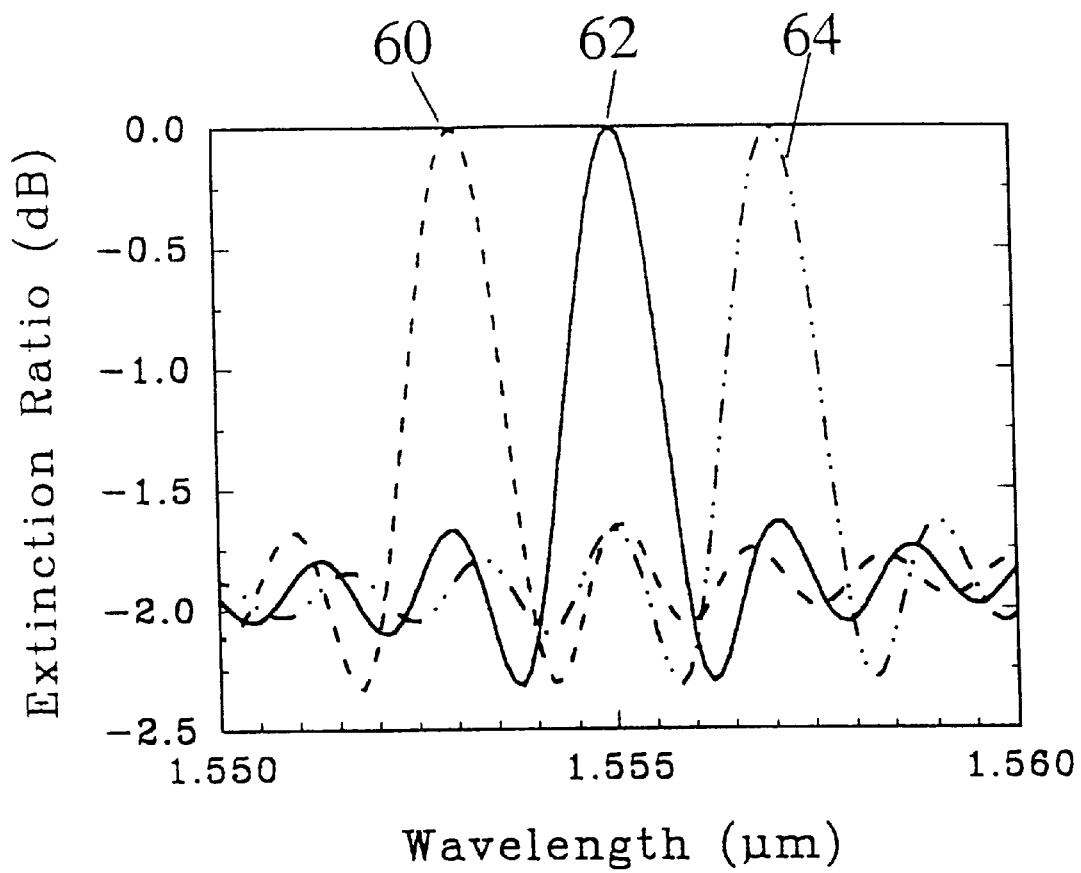
FIG. 6 is a graph of the filter extinction ratio for the filter of FIG. 1(b) as a function of the wavelength of a weaker of two signals launched into the filter.

FIG. 6 demonstrates that the stronger signal sets the spectral position of the induced filtering, i.e. it determines the centre frequency of the bandpass filter.

Figure 7A:
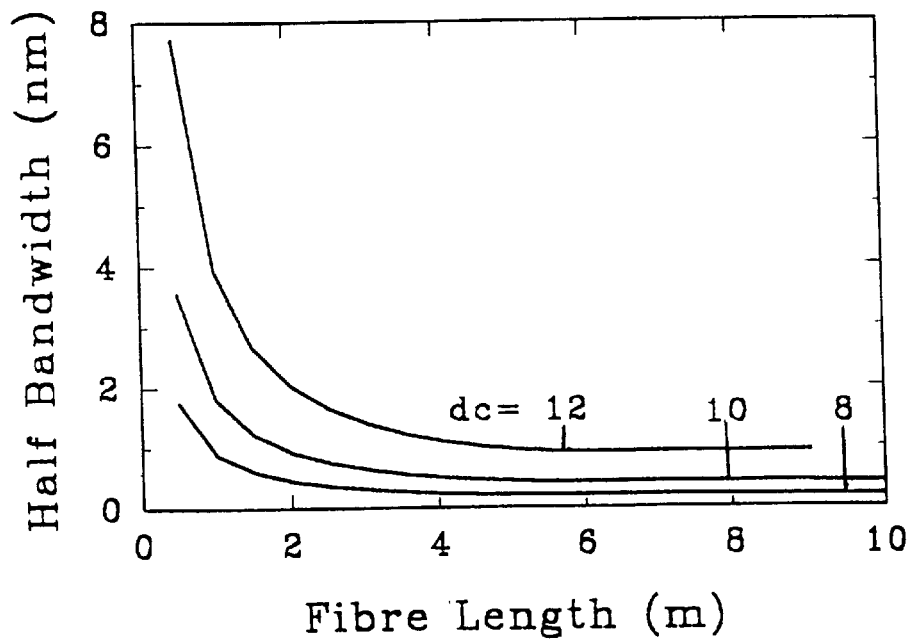
FIG. 7(a) is a graph of the filter bandwidth of the filter of FIG. 1(b) as a function of the fibre length for different normalised intercore separations.
Figure 7B:
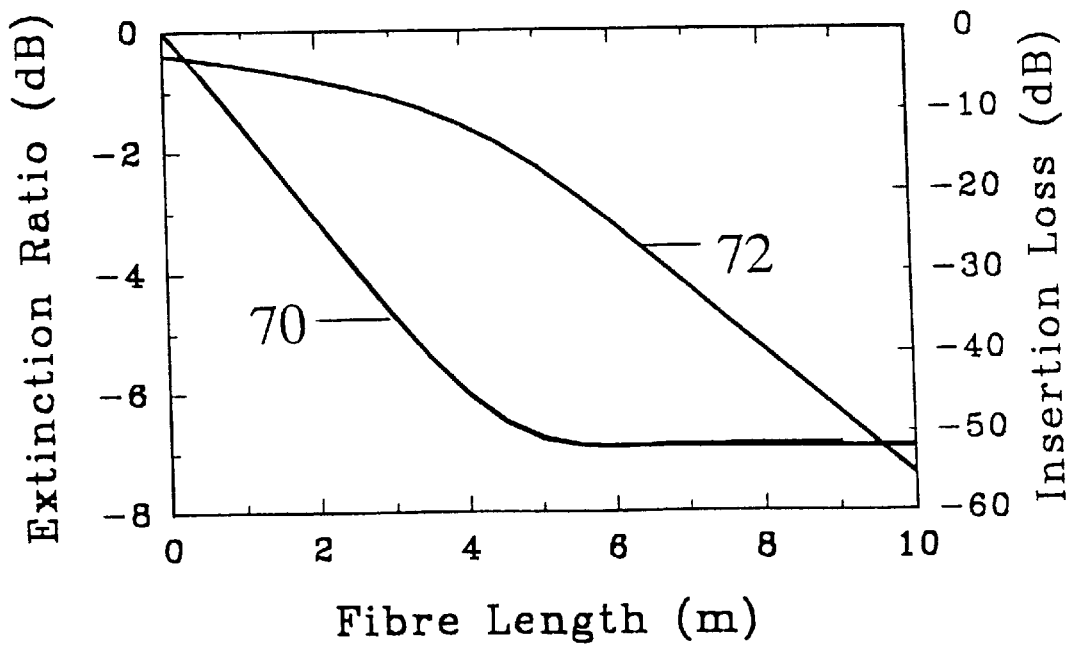
FIG. 7(b) is a graph of the filter bandwidth of the filter of FIG. 1(b) as a function of the fibre length for different normalised intercore separations.

So far, it has been shown that the spectral position of the filter is set by the strongest signal while the filter bandwidth is related to and, ultimately, determined by the characteristic length which, in turn, is a function of the fibre length and core-to-core separation. In FIGS. 7(*a*) & (*b*), the bandwidth, as well as the extinction ratio and insertion loss of the filter, are plotted as a function of the fibre length, for a number of normalised core-to-core separations (dc). The fibre NA is 0.3, the dopant concentration is $10^{25}$ ions/m³ (ions per cubic meter), and the filter centre wavelength 1.555 μm. The input powers of the stronger signal and the weaker signal are 0 dBm and −20 dBm respectively.

FIG. 7(*a*) demonstrates that, in the ranges shown, for a certain core-to-core separation, the filter bandwidth decreases predominantly inversely with the fibre length. This is because, for a certain fibre length, the bandwidth, as already mentioned, is associated with the maximum extinction ratio wavelength difference and is closely related to the fibre characteristic length ($L_{EDF}$ ~¾ $L_{CH}$) The characteristic length varies inversely with the wavelength difference, which explains the dependence shown in FIG. 7(*a*).

The filter 20 is of absorptive type and, therefore, variations in length or bandwidth affect the extinction ratio and insertion loss, as shown in FIG. 7(*b*). For a given dopant concentration and core-to-core separation, increasing the fibre length decreases the bandwidth and, at the same time, increases the extinction ratio and the insertion loss. Up to a certain insertion loss (~15 dB), the extinction ratio increases with the fibre length. Further increase in length, however, attenuates strongly both signals and clamps the extinction ratio to a substantially constant value.

FIG. 7(*a*) also demonstrates that the core-to-core separation affects the fibre characteristic length and, therefore, the bandwidth associated with a certain fibre length. On the other hand, as shown in FIG. 7(*b*), it has negligible effect on the extinction ratio (curve 70) and insertion loss (curve 72). These features can actually be used in controlling the filter bandwidth independently, that is to say, without affecting its extinction ratio and/or insertion loss.

Figure 8:
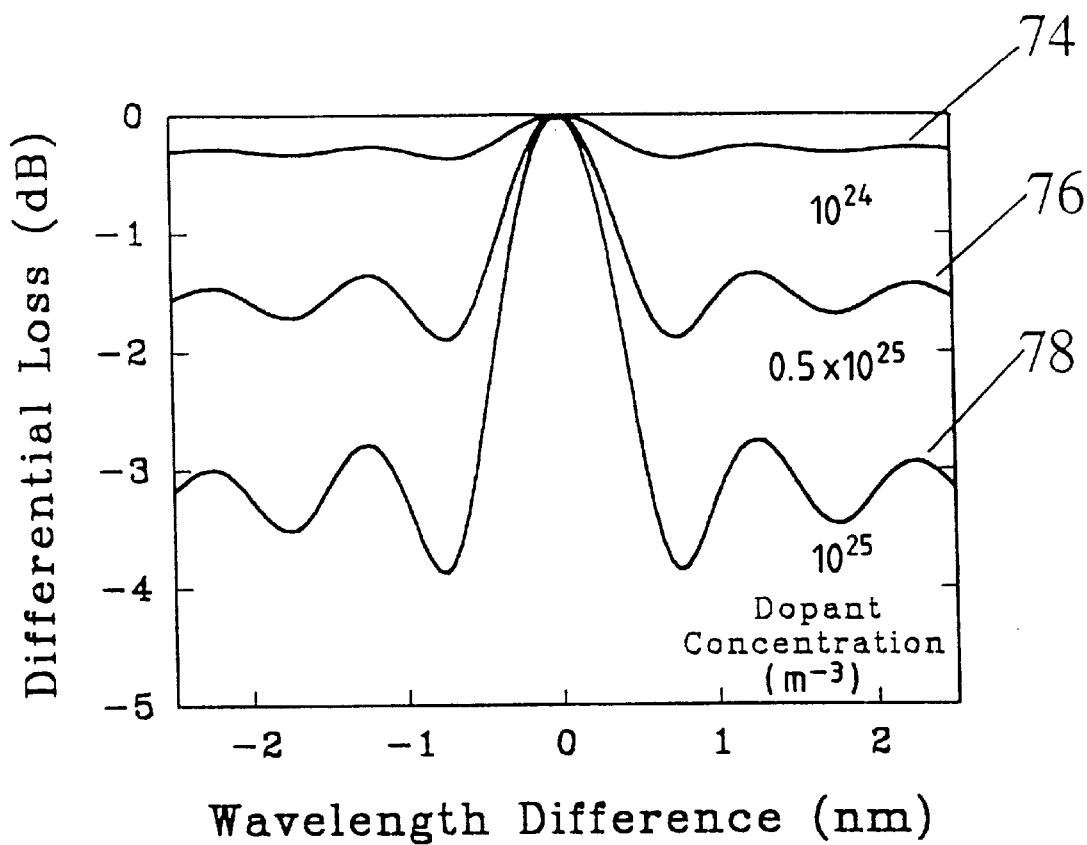
FIG. 8 is a graph of the filter extinction ratio against wavelength difference between two optical signals launched into the filter of FIG. 1(b), for various concentrations of the fibre dopant.

Since the filter is of absorptive type and its extinction ratio is a result of the differential loss experienced by the two wavelengths, it can be readily anticipated that, for a certain bandwidth (a specific fibre length and core separation) the extinction ratio can be increased by increasing the dopant concentration. In FIG. 8, the effect of the dopant concentration on the extinction ratio is plotted against wavelength difference between the stronger and weaker signals, for dopant concentrations of $10^{24}$ ions/m³ (curve 74), $0.5 \times 10^{25}$ ions m⁻³ (curve 76) and $10^{25}$ ions/m³ (curve 78). The fibre length is 2.475 m, the normalised core separation is 10 and the corresponding filter bandwidth is ~1.5 nm.

FIG. 8 demonstrates that by increasing the dopant concentration from $10^{24}$ to $10^{25}$ ions/m³, the extinction ratio increases from 0.37 dB to 3.86 dB. However, as expected, the extinction ratio improvement is achieved at the expense of higher insertion loss which, in this case, increases from ~3.3 dB to ~6.98 dB.

Overall, it is preferred that the dopant concentration is between about $10^{22}$ and $10^{26}$ ions per cubic meter.

Figure 9A:
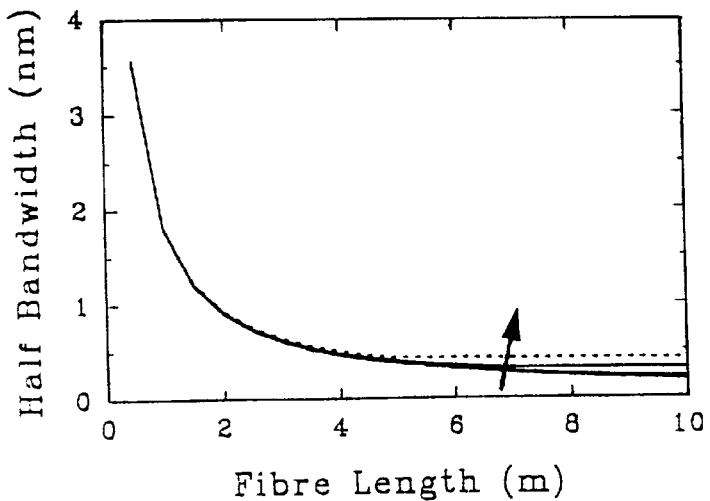
FIG. 9(a) is a graph of filter bandwidth against fibre length in the filter of FIG. 1(b), for various dopant concentrations.
Figure 9B:
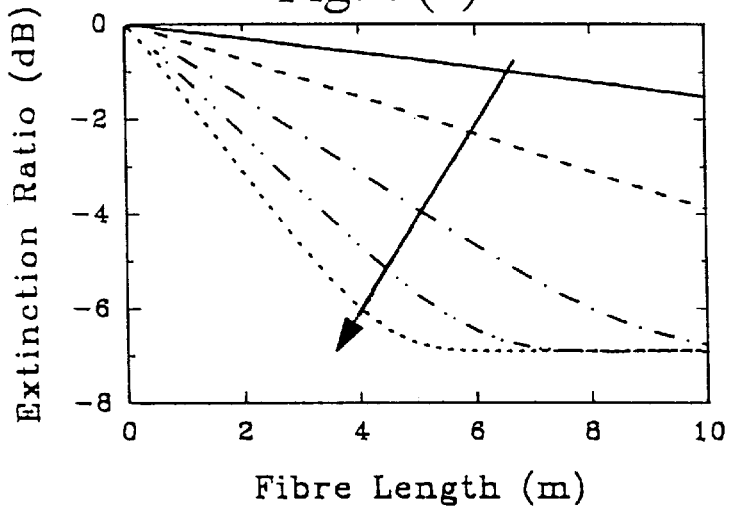
FIG. 9(b) is a graph of filter extinction ratio against fibre length in the filter of FIG. 1(b), for various dopant concentrations.
Figure 9C:
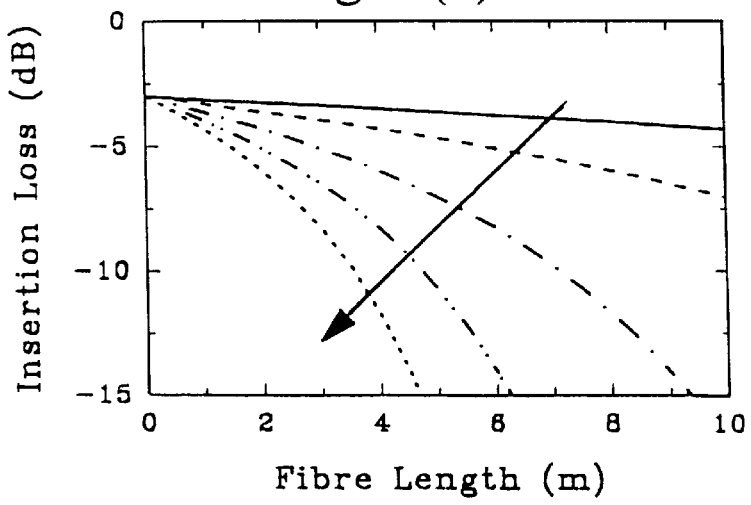
FIG. 9(c) is a graph of filter insertion loss against fibre length in the filter of FIG. 1(b), for various dopant concentrations.

In FIGS. 9(*a*) to 9(*c*), the bandwidth, extinction ratio and insertion loss of the filter are plotted against the fibre length, for various dopant concentrations. In each case, the dopant concentration increases between the family of curves in the direction of the arrow, from $10^{24}$ ions/m³ to $10^{25}$ ions/m³. The normalised core separation is 10, the wavelength and input power of the stronger signal are 1.555 μm and 0 dBm, respectively, and the input power of the weaker signal is −20 dBm.

FIGS. 9(*a*) to 9(*c*) demonstrate that for a certain fibre length, the filter extinction ratio and insertion loss increase with dopant concentration. The bandwidth, on the other hand, remains almost unaffected by the concentration variation. It is only for relatively long fibre lengths and high dopant concentrations and insertion loss exceeding ~15 dB, that the dopant concentration has an effect on the filter bandwidth.

Figure 10A:
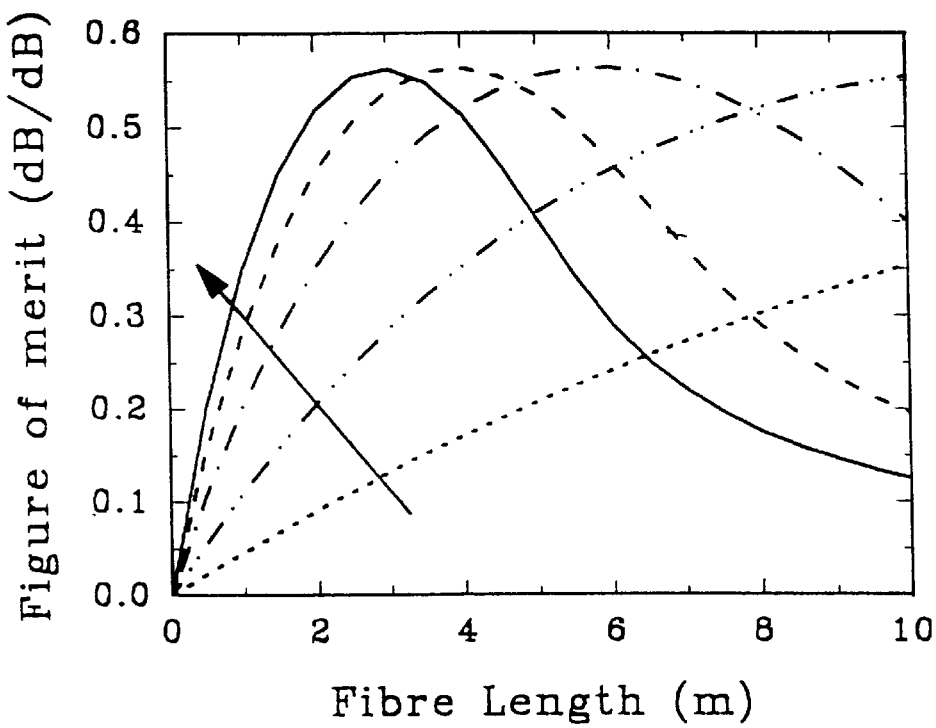
FIG. 10(a) is a graph of a filter 'figure of merit' against fibre length for the filter of FIG. 1(b), for various dopant concentrations.

The extinction ratio and insertion loss of the filter are interlinked, so that increasing one tends to result in an increase of the other. In order to calculate the effectiveness of a designed filter, a figure of merit is now introduced, which is defined as the ratio of filter extinction ratio to the corresponding insertion loss. In FIG. 10(*a*), the figure of merit (in dB/dB) is plotted against the fibre length for various dopant concentrations. Again, the dopant concentration increases between the family of curves in the direction of the arrow, from $10^{24}$ ions/m³ to $10^{21}$ ions/m³. For each concentration, the figure of merit first increases gradually with length reaching a maximum at an optimum length ($L_{opt}$). Beyond the optimum length, the figure of merit starts decreasing because any further increase in fibre length contributes mostly to uniform (rather than differential) attenuation of the two signals and so predominantly increases the insertion loss. For all dopant concentrations shown in FIG. 10(*a*), the maximum figure of merit is ~0.56 dB/dB.

Figure 10B:
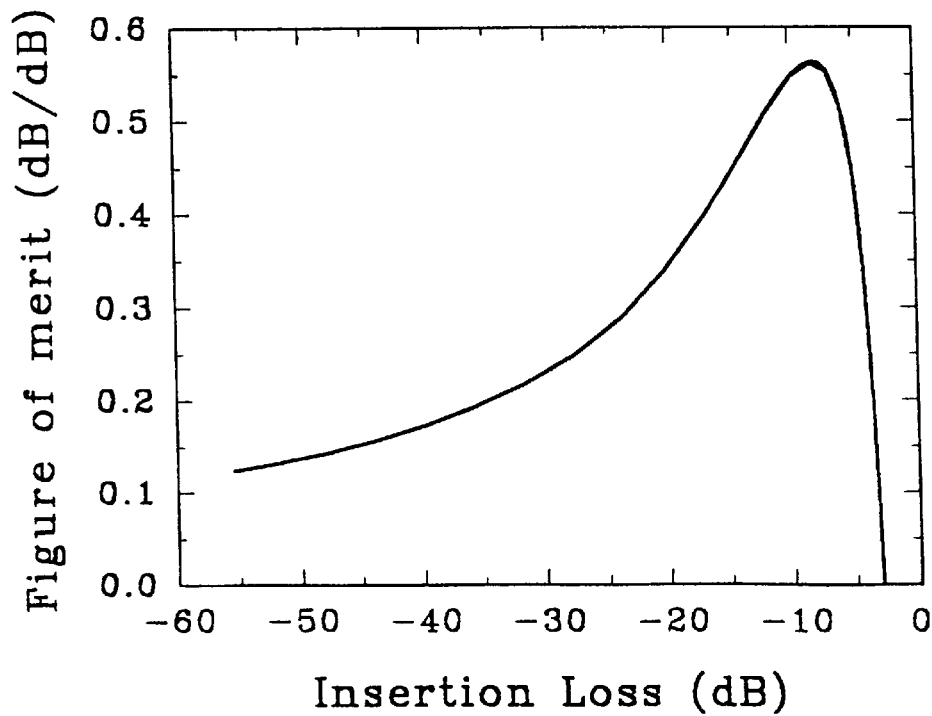
FIG. 10(b) is a graph of a filter 'figure of merit' against fibre insertion loss for the filter of FIG. 1(b), for various dopant concentrations.

FIG. 10(b) shows the figure of merit of the filter as a function of the filter insertion loss. Taking into account FIG. 7(b), it can be deduced that, for a certain fibre NA and signal input powers, the curve of FIG. 10(b) is independent of the dopant concentration and the core-to-core separation. From FIGS. 10(a) & (b), it can also be deduced that, for the above parameters, the maximum figure of merit (~0.56 dB/dB), which is obtained at optimum length, corresponds to an insertion loss of ~8.31 dB and extinction ratio of ~−4.68 dB (regardless of dopant concentration and/or intercore separation).

Figure 11:
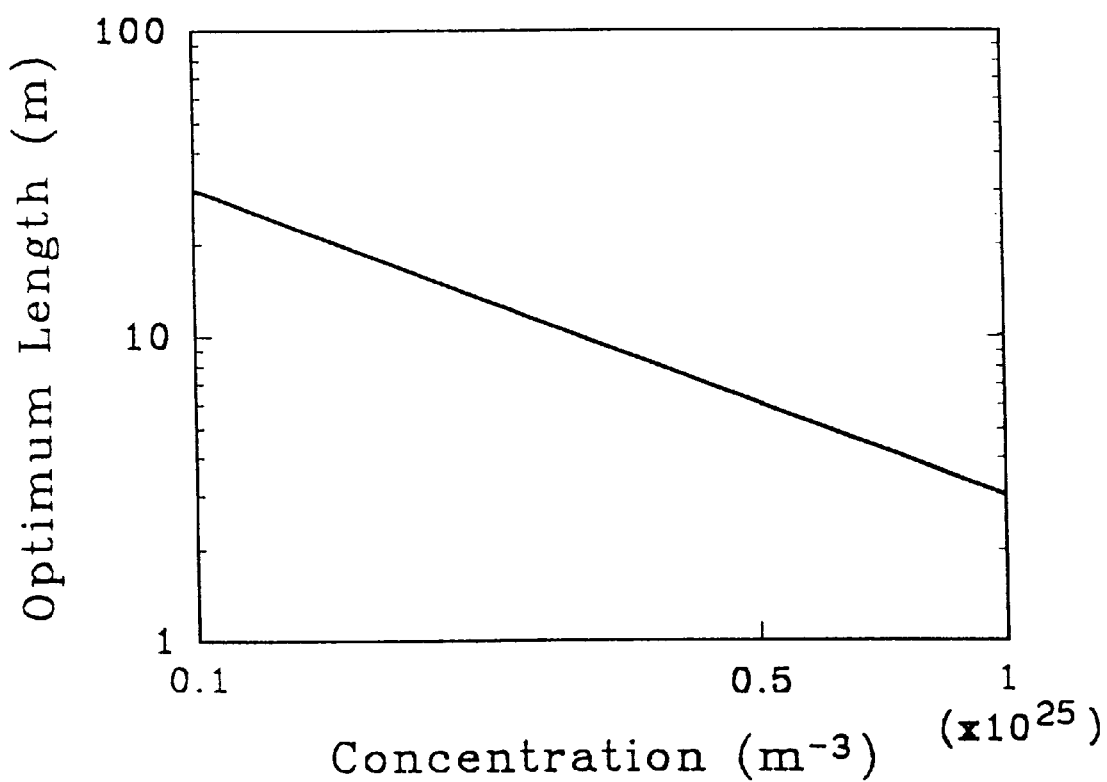
FIG. 11 is a graph of an optimum fibre length in the filter of FIG. 1(b) as a function of dopant concentration.

The optimum length is a key parameter in designing an efficient filter and, as shown in FIG. 11, it is inversely proportional to dopant concentration. The other parameters are similar to the ones of FIG. 10. FIG. 11 can serve as an engineering graph in designing optimised filters as described above.

The skilled man will appreciate that the term 'optimum' does not necessarily refer to an absolute maximum of performance, but instead refers to the result of an engineering process to improve the performance of the filter as far as is reasonable given other possible design constraints.

Figure 12:
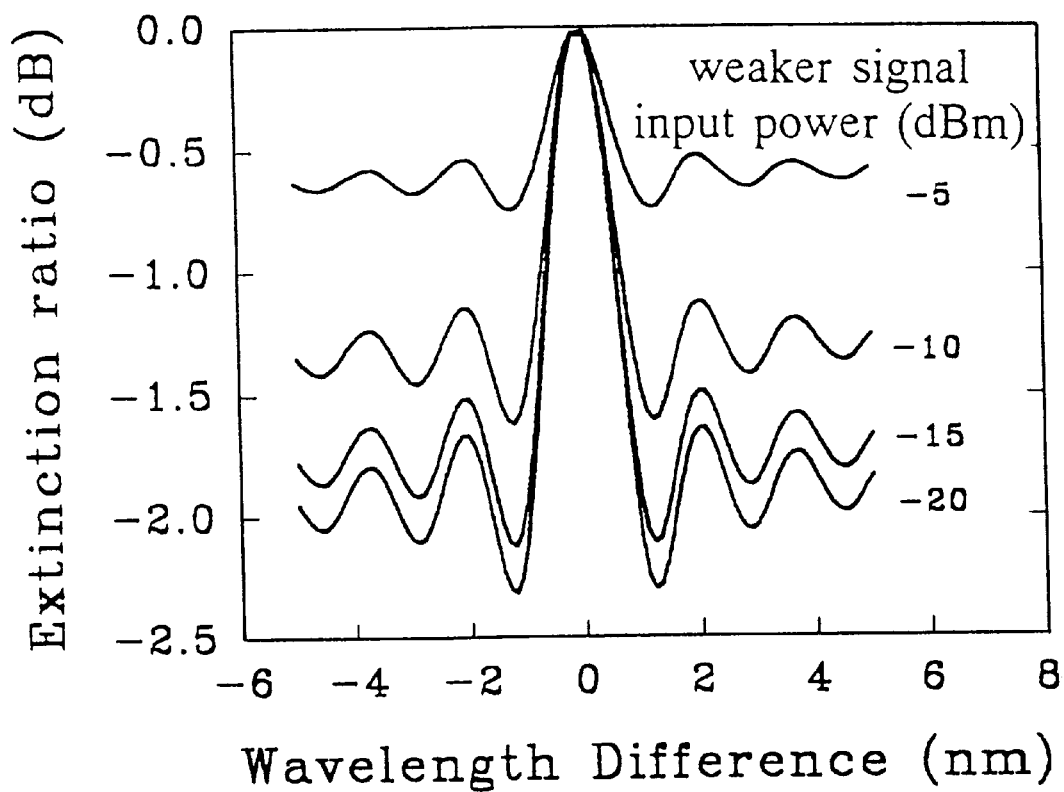
FIG. 12 is a graph of filter extinction ratio against the wavelength difference between two optical signals launched into the filter of FIG. 1(b), for various input powers of the weaker of the two optical signals.

The fact that the device operation relies on the saturable absorption of the dopant implies that the filter extinction ratio and insertion loss will be dependent on the relative input powers of both signals. FIG. 12 is a graph of the filter extinction ratio against wavelength difference for an input power of 0 dBm for the stronger signal and input powers of −5 dBm to −20 dBm for the weaker signal. The wavelength of the stronger signal is 1.555 μm, the fibre length is 1.5 m and the normalised core separation is 10. The dopant concentration is $10^{25}$ ions/m³. FIG. 12 demonstrates that by increasing the weaker signal's input power from −20 dBm to −5 dBm the extinction ratio is reduced from ~−2.3 dB to ~−0.75 dB. The insertion loss, on the other hand, decreases slightly from ~−5 dB to ~−4.6 dB. The bandwidth remains constant at ~2.4 nm.

Figure 13:
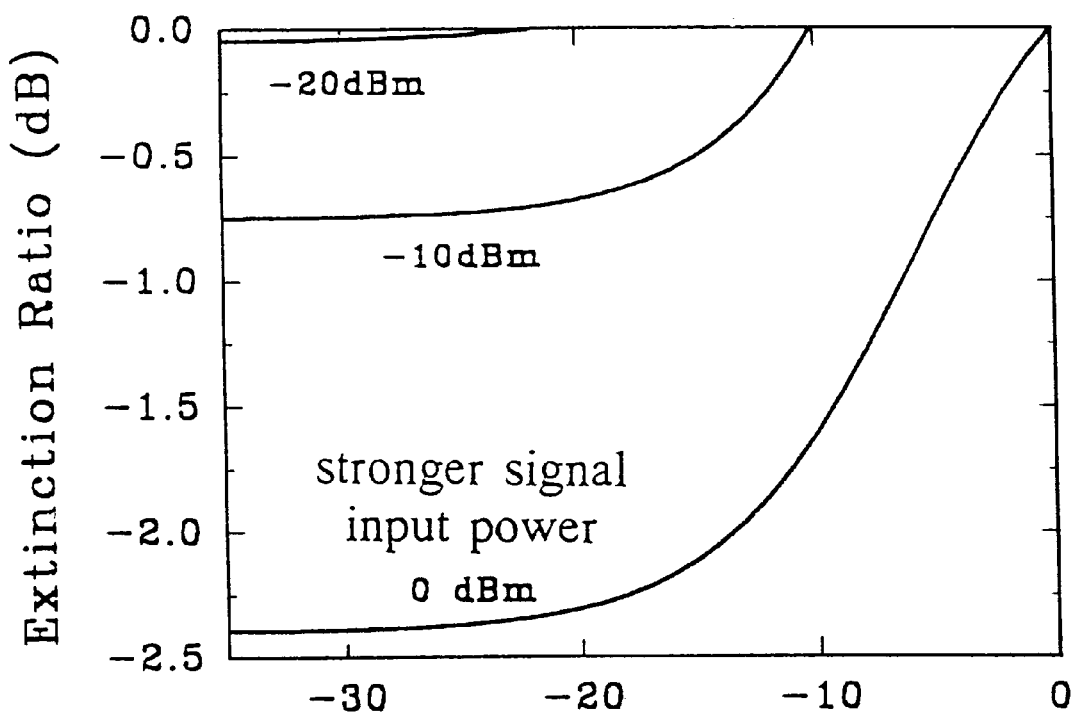
FIG. 13 is a graph of filter extinction ratio as a function of the input power of the weaker of two optical signals launched into the filter of FIG. 1(b), for various input powers of the stronger signal.

FIG. 13 is a graph of filter extinction ratio as a function of the input power of the weaker of two optical signals launched into the filter of FIG. 1(b), for various input powers of the stronger signal. In FIG. 13, the filter extinction ratio is plotted against the weaker signal's input power, for input powers of 0 dBm, −10 dBm and −20 dBm for the stronger signal. As shown, the extinction ratio variation with the power of the weaker signal conforms broadly with a typical saturation curve of the dopant (FIG. 2(b)). The extinction ratio increases gradually as the weaker signal's power decreases and, finally saturates for signal powers of less than −20 dBm. For weaker signal input powers close to the power of the stronger signal, the extinction ratio is negligibly small. For $P_{S2} > P_{S1}$ (where $P_{S1}$ and $P_{S2}$ are the input powers of the stronger and weaker signals respectively), the extinction ratio becomes positive which simply means that the role and behaviour of the stronger and weaker signals are interchanged.

Figure 14A:
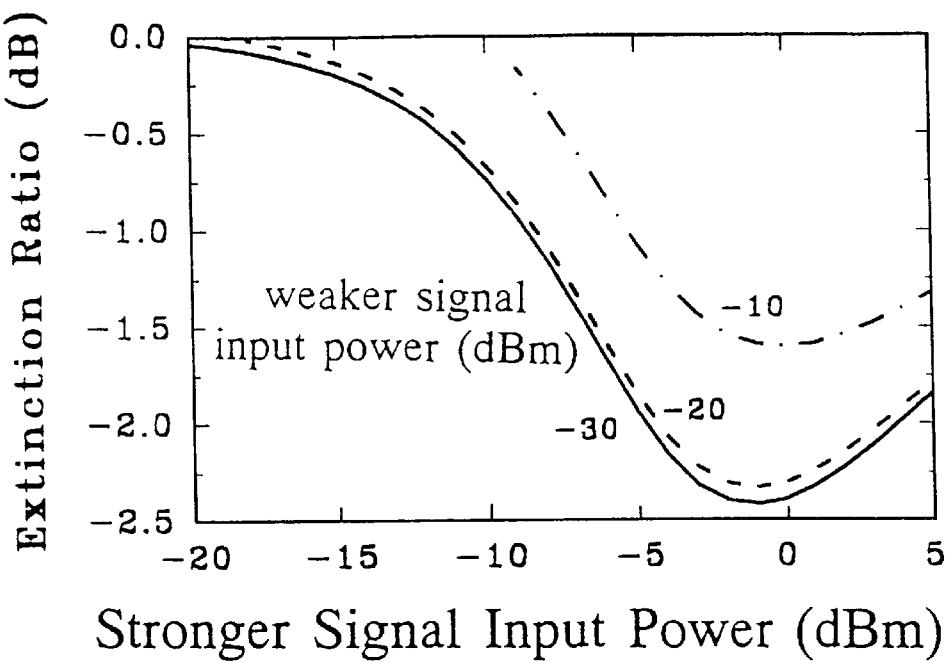
FIG. 14(a) is a graph of filter extinction ratio against the input power of the stronger of two signals launched into the filter of FIG. 1(b), for various input powers of the weaker of the two signals.
Figure 14B:
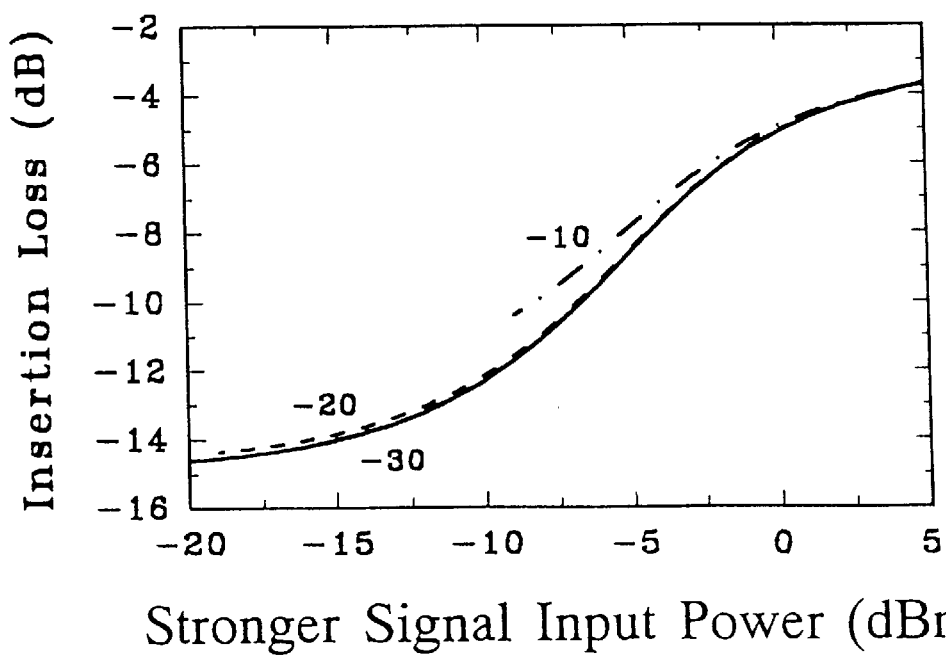
FIG. 14(b) is a graph of filter insertion loss against the input power of the stronger of two signals launched into the filter of FIG. 1(b), for various input powers of the weaker of the two signals.

FIGS. 14(a) and 14(b) are graphs of the filter extinction ratio and insertion loss respectively against the input power of the stronger of two signals launched into the filter of FIG. 1(b), for various input powers of the weaker of the two signals (−10 dBm, −20 dBm and −30 dBm).

The extinction ratio increases gradually with the power of the stronger signal (i.e. as the power difference $P_{S1} - P_{S2}$ increases). With the example parameters in use, for all $P_{S2}$ the maximum extinction ratio is obtained for input powers of the stronger signal of around 0 dBm (~−3 dBm to ~+2 dBm). For input powers $P_{S1}$ outside this range, the extinction ratio decreases again due to the saturation characteristics (saturable absorption) provided by the dopant. The insertion loss increases monotonically with decreasing $P_{S1}$, following closely the saturation curve of the medium. Above the maximum extinction ratio range, the insertion loss is relatively small.

The details described above can be used in designing a dual-core fibre filter with a desired bandwidth and extinction ratio. For a given fibre NA, FIGS. 9(b) and 9(c) can be used to select the dopant concentration and fibre length to give the desired bandwidth and the tolerable insertion loss. Subsequently, FIG. 7(a) can be used to determine the core-to-core separation required to achieve the desired filter bandwidth.

Figure 15:
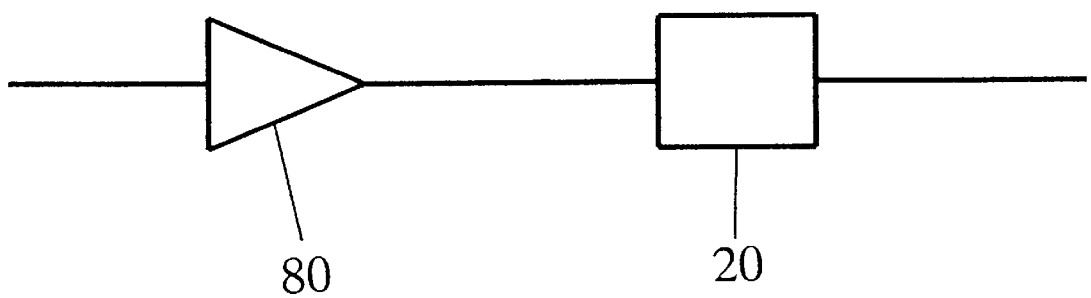
FIG. 15 is a schematic diagram of a dual-core fibre filter connected in series with an optical limiting amplifier.

From FIG. 14(a), it is clear that in order to achieve a maximum extinction ratio in these examples, the input power of the (strong) writing signal should be kept at 0±2.5 dBm. As shown in FIG. 15, this can be achieved by using the filter 20 in conjunction with an optical limiting amplifier 80. Optical limiting amplifiers (such as those described in British patent application number 9209095.0) can provide a substantially constant output at an adjustable level for a wide range of input signal powers (>35 dB). The non-linear response of the optical limiting amplifier 80 can be adjusted so that the weaker signal remains weak and is not boosted to the level of the stronger signal.

So far, the investigation of the filter performance has been focused on the case of two different wavelengths. The use of the filter for filtering repetitive or pseudo-random pulse trains such as those used in solutions communications will now be discussed. In this case, the filter can also exhibit so-called 'sliding-filter' characteristics.

Figure 16A:
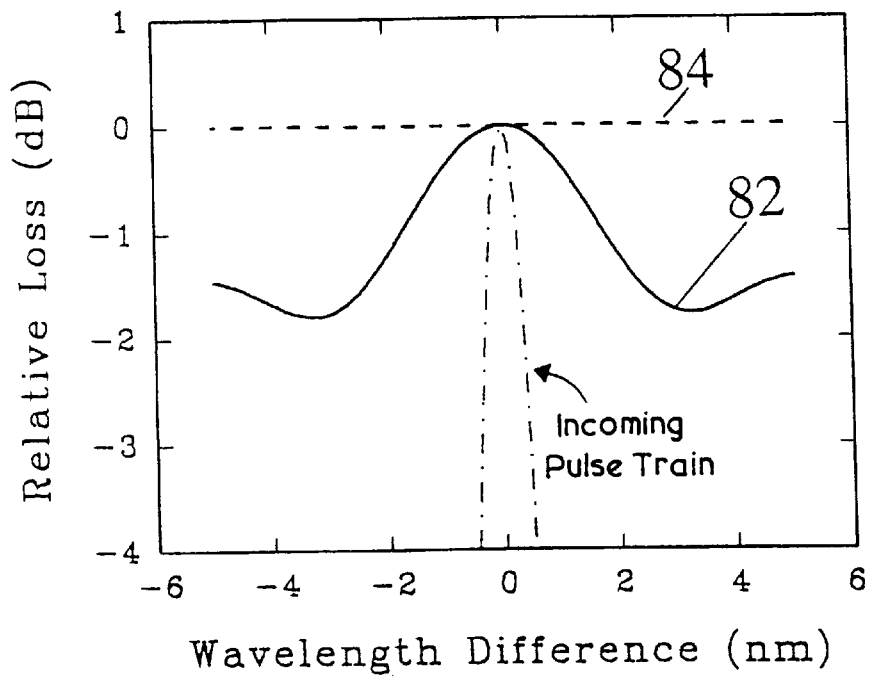
FIG. 16(a) is a graph of the relative optical loss for an incoming gaussian-pulse train in the case of dual-core and single-core fibre.
Figure 16B:
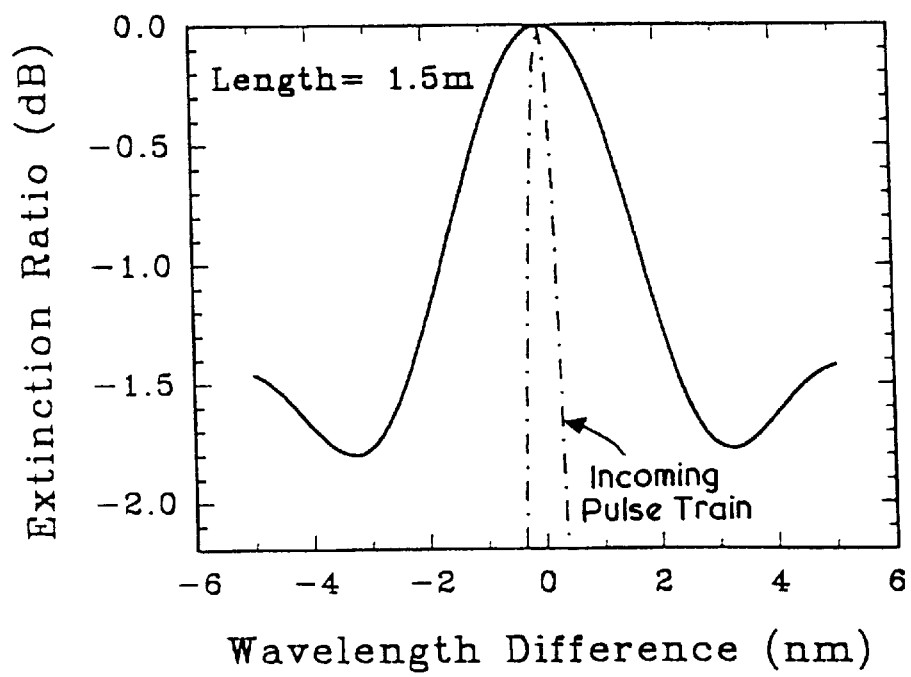
FIG. 16(b) is a graph of the filter extinction ratio for an incoming gaussian-pulse train in the case of dual-core and single-core fibre.

A typical response of the filter 20 to a stream of incoming Gaussian pulses of 10 GHz (gigahertz) bandwidth and average power of −5 dBm is shown in FIGS. 16(a) and 16(b).

FIG. 16(a) shows the filter's relative loss (normalised to the peak power at the centre wavelength) against the wavelength difference from the pulse centre wavelength ($\lambda_0 =$ 1550 nm), for a dual-core filter (curve 82) and, for comparison, a single core fibre (curve 84). Curve 82 demonstrates that the dual-core fibre functions as a bandpass filter which passively tailors its response around the pulse centre wavelength, i.e. the wavelength which carries the relatively highest power. For comparison curve 84 corresponds to the response of a single-core doped fibre which, as expected, saturates homogeneously and provides a uniform attenuation across the entire pulse spectrum.

Similarly, FIG. 16(b) is a graph of the filter extinction ratio for an incoming gaussian-pulse train in the case of dual-core filter and a single-core fibre.

The filter bandwidth, the extinction ratio and the insertion loss depend on the fibre parameters (i.e. fibre NA, length and core separation), dopant concentration, and pulse stream average power in a fashion similar to the one applying to the two-wavelength filtering described above.

So far in this particular example, in evaluating the filter characteristics, the emission and absorption cross-sections of $Er^{3+}$ (erbium) were considered constant across the entire spectrum. This simplification was adopted in order to investigate effects purely due to spatial hole burning and saturable absorption and not to obscure the filter response with spurious effects originating from spectral variations. Besides, this is a reasonable assumption in various parts of the $Er^{3+}$ emission and absorption spectra, especially for narrow bandwidth incoming pulse trains or other dopants with much flatter spectra.

When the real variations in the emission and absorption spectra are taken into account, in addition to self-writing and adjustment, another property of the proposed device is manifested when used for pulse filtering. This property is that the filter, although retaining its bandpass characteristics, shifts (slides) its spectral position with respect to the spectrum of the incoming pulse. The shift (sliding) of the filter centre frequency depends on the spectral characteristics of the added saturable absorber. The shift of the centre frequency occurs due to variation of the emission and absorption cross-sections of the dopant (saturable absorber) with wavelength. The polarity of the slope of this variation defines the direction of the shift. In this particular example, the filter sliding follows the (emission and absorption) spectrum slope, i.e, the filter response is shifted towards the decreasing emission and absorption cross-sections.

Figure 17:
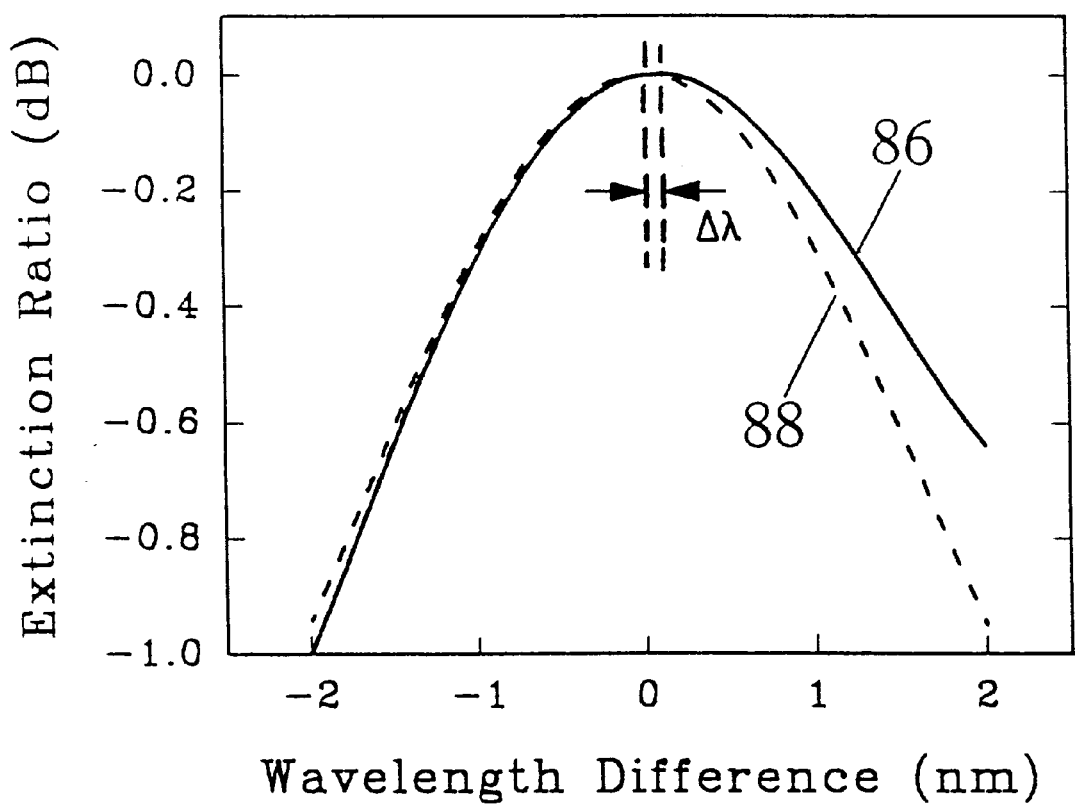
FIG. 17 is a graph illustrating the relative spectral positions of input and output pulse trains, illustrating a spectrum sliding effect.

In FIG. 17, the transmission characteristics of an erbium-doped germano-silicate dual-core filter (curve 86) are plotted for an incoming Gaussian pulse of centre frequency 1.555 μm (the so-called second absorption peak). For comparison, the curve 88 represents the transmission of the filter without the spectral variation of the various cross-sections taken into account. A shift of the centre frequency of $-0.1$ nm is shown. The spectrum shift exhibited by the filter enables it to be used as a passive sliding filter to reduce the noise-induced jitter in long communication solution links.

FIG. 18(a) illustrates an arrangement for use in applications where the central wavelength of the outgoing pulse train is required to be unshifted. In this case, the sliding effect can be counteracted by cascading the dual-core filter 20 with a broadband fixed filter 90. The response of the dual-core filter 20 is illustrated schematically in FIG. 18(b) and the response of the broadband fixed filter 90 is illustrated schematically in FIG. 18(c).

In this case, the transmission slope of the fixed filter causes the spectrum of the pulse train to move in the opposite direction and the total frequency slide is reduced. Alternatively, use of a fixed filter with opposite slope can add to the inherent frequency sliding of the dual-core filter and result in increased total sliding.

Figure 19A:
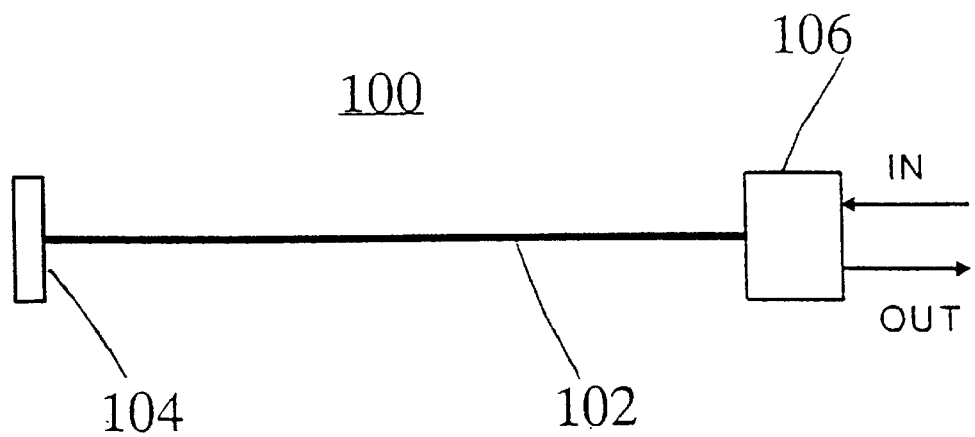
FIG. 19(a) is a schematic diagram illustrating a basic configuration of a reflective-type optical fibre filter.

FIG. 19(a) is a schematic diagram illustrating a basic configuration of a reflective-type optical fibre filter 100. The filter 100 comprises a length of doped unpumped single core optical fibre 102 terminated at one end by a substantially 100% reflector 104. The reflector can be, for example, a mirror or a Bragg grating.

Figure 19B:
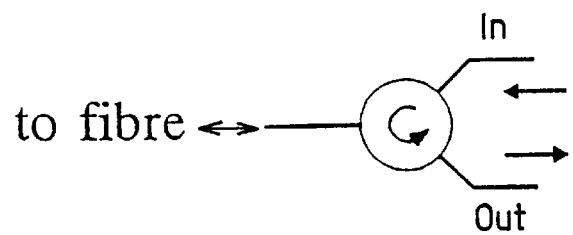
FIG. 19(b) is a schematic diagram of a circulator launching system for the filter of FIG. 19(a)
Figure 19C:
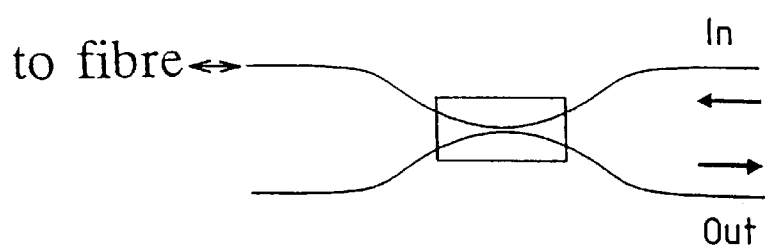
FIG. 19(c) is a schematic diagram of a coupler launching system for the filter of FIG. 19(a)

At the other end, the fibre is connected to a launching system 106 to couple in and out the optical signals. Two examples of a launching system are illustrated in FIGS. 19(b) and 19(c). In particular, FIG. 19(b) illustrates a circulator launching system and FIG. 19(c) illustrates a 50:50 coupler launching system.

The filter 100 relies on the wavelength dependence of a standing-wave pattern formed by incoming and reflected light to partially separate the various wavelengths. The period of the standing wave is equal to half of the optical wavelength, so the period will be different for slightly different wavelengths. When two or more optical signals of different powers are launched into the filter 100, the more powerful signal will saturate certain regions of the fibre 102 at the peaks of its standing wave pattern. However, the peaks of the standing wave patterns formed by the other, weaker, signal(s) will not fully coincide with the regions of saturated absorber, and so the loss sustained by the weaker signal(s) will be greater than that sustained by the stronger signal.

Figure 20:
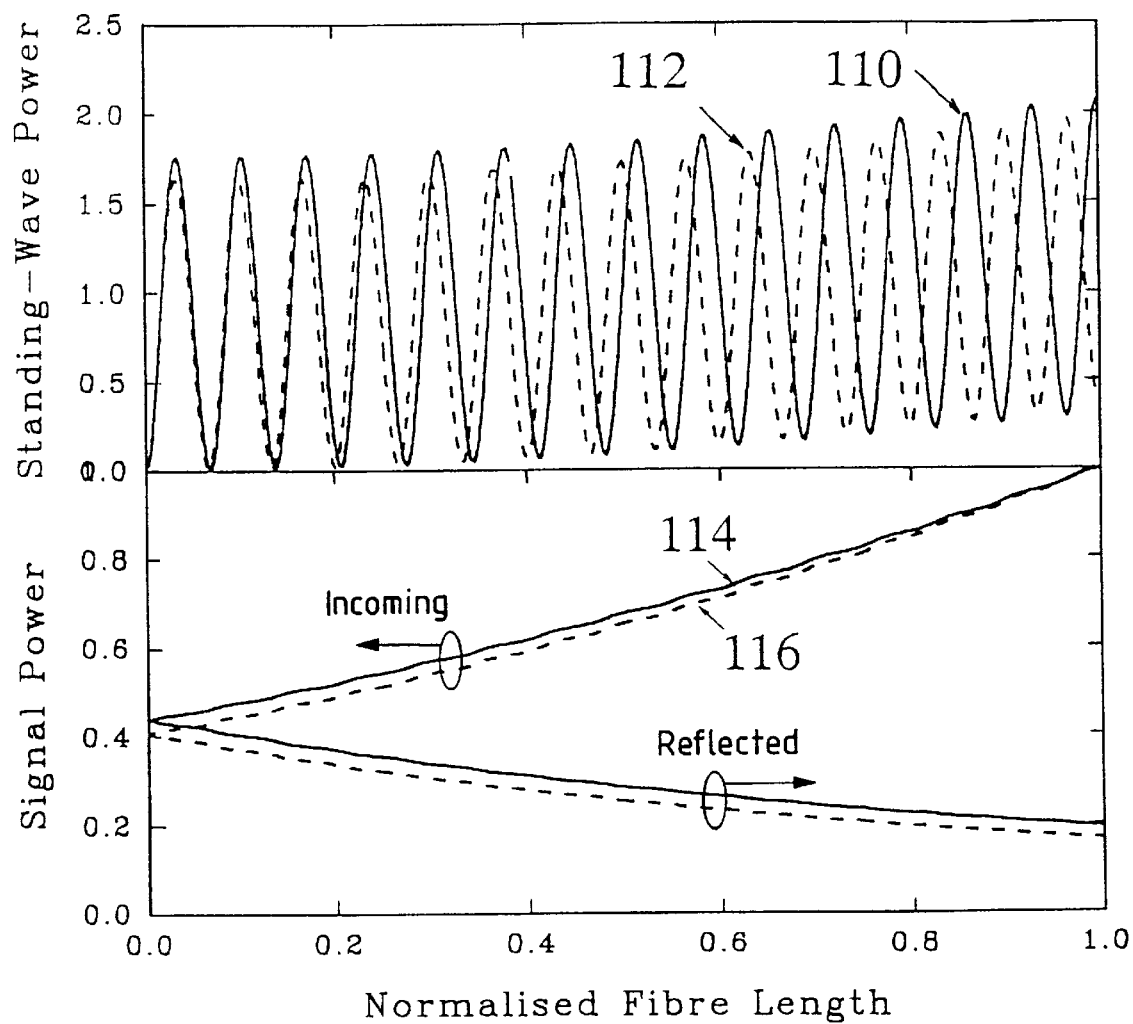
FIG. 20 is a graph illustrating standing-wave patterns along the filter of FIG. 19(a), for two different input optical signals, and the normalised power of the interfering waves (forward and backward) within the filter, for the two optical signals.

FIG. 20 is a graph illustrating standing-wave patterns along the filter of FIG. 19(a), for two different input optical signals, and the normalised power of the interfering waves (forward and backward) within the filter, for the two optical signals. The stronger signal (having a wavelength of 1.555 μm and an input power of $-10$ dBm) is represented by a curve 110 and the weaker signal (having a wavelength of 1.55505 μm and input power of $-30$ dBm) by a curve 112.

In FIG. 20, the reflector 104 is positioned at the left hand side of the fibre, i.e. at the '0' position. The optical powers are normalised to the input counterparts while the length is normalised to the characteristic length. The characteristic length ($L_{ch}$) for the standing wave pattern is the distance between positions in the fibre at which the two standing wave patterns are in phase, and is given by:

$$L_{ch} = \lambda_1 \lambda_2 / 2|\lambda_1 - \lambda_2|$$

where $\lambda_1$ and $\lambda_2$ are the wavelengths of the first and second optical signals respectively in the optical fibre.

In this embodiment, the filter length may be defined as between about 100 and about 10000 times the wavelength of the predominant (first) signal in the optical fibre.

In the example case of $Er^{3+}$, the dopant concentration is $10^{27}$ ions/m$^3$. However, other materials, such as $Pr^{3+}$ (praseodymium) doped Gallium-Lanthanum-Sulphur (GLS) fibres, could be used and, in this case, the concentration could be different.

Owing to the wavelength difference the two interference patterns, although overlapping close to the reflector, gradually move out of phase and separate spatially. In the lower portion of FIG. 20, the power of the incoming (left travelling) wave and reflected (right travelling) wave are plotted as a function of the fibre length for both the stronger signal (curve 114) and the weaker signal (curve 116). Both wavelengths attenuate as they propagate forwards and are then reflected backwards, with the weaker suffering heavier losses than the strongest signal. The power imbalance between forward the backward waves gradually deteriorates on moving away from the reflector and, as a result, the contrast of the interference pattern decreases (the total power does not return to zero).

Figure 21:
FIG. 21 is a schematic diagram of a second embodiment of a reflective-type filter.

From FIG. 20, it is apparent that along the fibre segment (~25% of total length) closest to the reflector the two standing-wave patterns effectively overlap. In other words, this fibre segment contributes negligibly to the total wavelength decoupling (the filtering action) but instead merely attenuates the forward and backward waves. Hence, the fibre segment not only increases the filter insertion loss but also decreases the extinction ratio by deteriorating the contrast of the interference pattern along the remaining fibre length. Therefore, replacing this doped fibre segment by a similar lossless fibre can result in an improved filter. FIG. 21 is a schematic diagram of a second embodiment of a reflective-type filter in which a section 120 of the filter is made of undoped fibre. The section 120 could be, for example, between 1 and 30% of the filter length. The filter of FIG. 21 provides a higher extinction ratio and a lower insertion loss in comparison with the filter of FIG. 19.

Figure 22A:
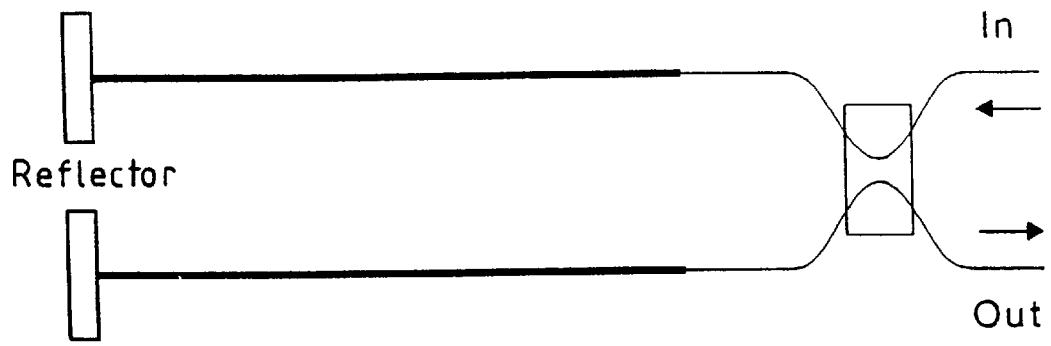
FIGS. 22(a) and 22(b) are schematic diagrams of further embodiments of a reflective-type filter.
Figure 22B:
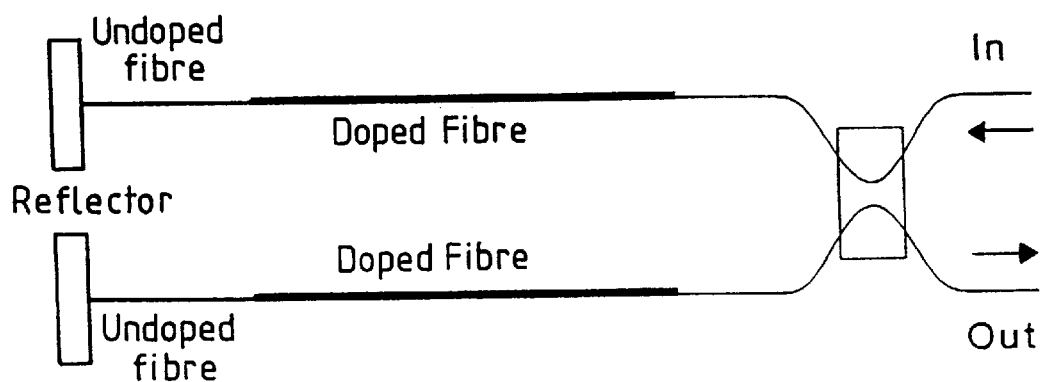

FIGS. 22(a) and 22(b) are schematic diagrams of further embodiments of reflective-type filters, which make better use of the optical power in the case that a 50:50 optical coupler is used as a launching system.

In FIGS. 22(a) and 22(b), two identical reflective-type filters, similar to those illustrated in FIGS. 19 and 21 respectively, are spliced into the output ports of a 50:50 optical coupler. Input light is launched into one of the input ports.

Owing to a half-wave (π/2) phase shift associated with the cross-coupling at the fibre coupling region, light reflected from the filters interferes constructively and appears substantially entirely in the other input port (i.e. the input port not used to receive incoming light). At the input port used to receive incoming light, however, the interference is destructive and there is practically no reflected light.

The performance characteristics of the reflective-type filter, i.e. bandwidth, extinction ratio and insertion loss, will depend on the fibre and optical parameters in a fashion analogous to the case of the transmissive-type dual-core filter. However, in order to achieve the same bandwidth as the transmissive-type filter (appropriate for telecommunication applications), the length of the reflective-type filter should be kept short (e.g. between 0.5 and 10 times the characteristic length). The reason for this is that the standing-wave pattern, which is responsible for the wavelength separation in the reflective-type filter, has a period of about three to four orders of magnitude (1000 to 10000 times) smaller than the period of cross-coupling (coupling length) which is responsible for the wavelength separation in transmissive-type filter. On the other hand, in order to obtain appreciable extinction ratio, the dopant concentration should be increased considerably (possibly by more than two orders of magnitude).

These factors make the techniques described above particularly applicable to planar as well as fibre waveguides, because of the relative ease of phase tuning in planar technology.

The required fibre length (L) is inversely proportional to the filter bandwidth (BW). Hence, in these examples for 1 nm bandwidth the required fibre length is about 1 mm. For telecommunication applications, reflective-type filters can, for example, be implemented by using short highly Erbium-doped silica fibres or Praseodymium-doped Gallium-Lanthanum-Sulphur (GLS) fibres. On the other hand, when used as filtering elements for the implementation of single frequency laser, narrow-bandwidth reflective-type filters are implemented by using longer lengths of moderately-doped fibres.

Figure 23A:
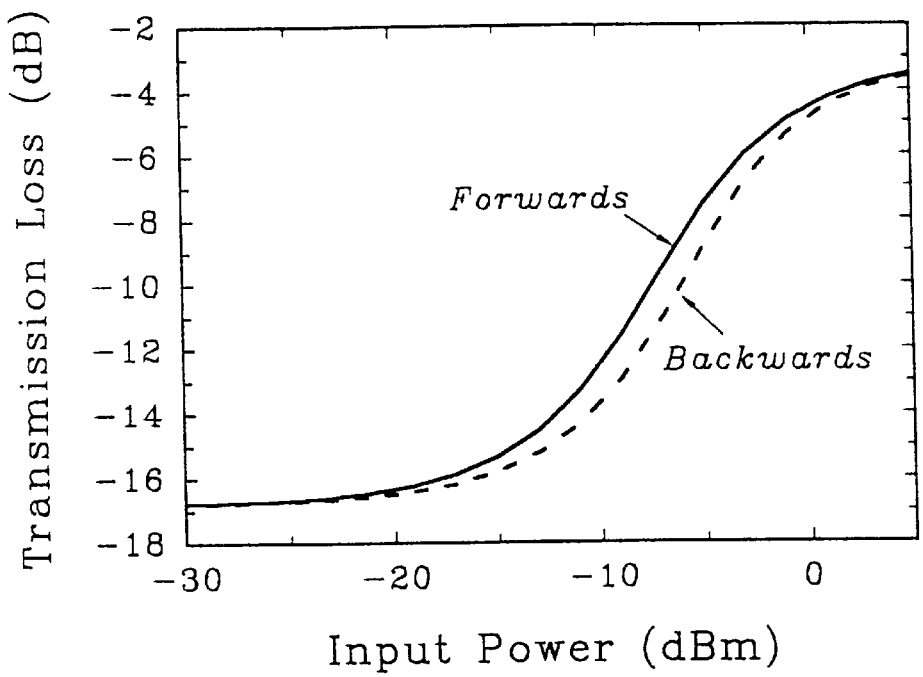
FIGS. 23(a) and 23(b) illustrate operation of the filter of FIG. 1(b) as an optical isolator.
Figure 23B:
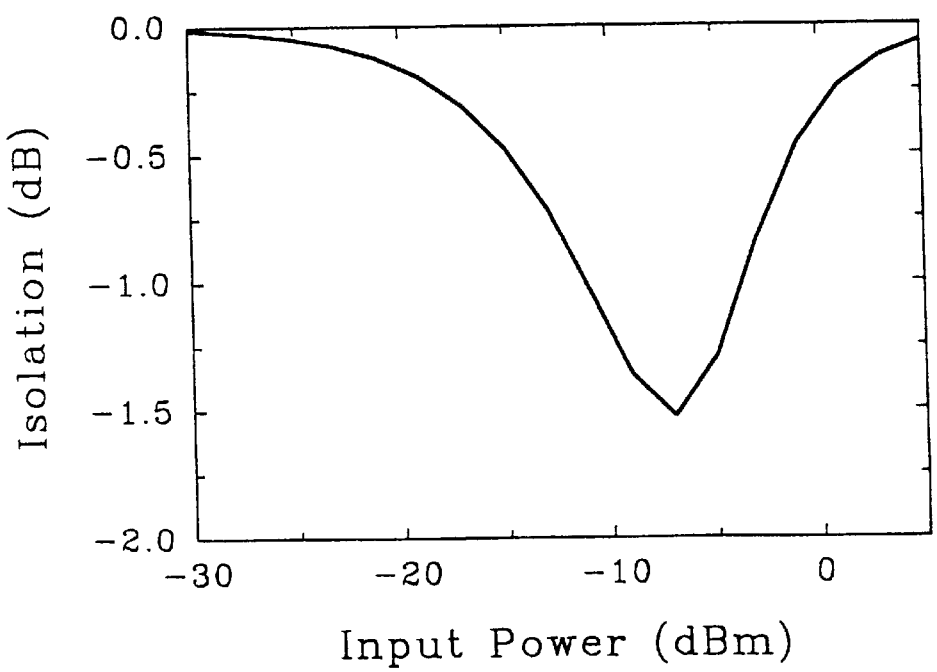

Finally, FIGS. 23(a) and 23(b) illustrate the operation of the filter of FIG. 1(b) as an optical isolator.

An optical isolator is used to reject light propagating in one direction towards the isolator. For example, an isolator may be placed between two series-connected optical elements to reject light reflected back from the second of the elements.

In the present case, if a filter is defined by a first (stronger) signal propagating in a forward direction (from left to right as shown) in the filter of FIG. 1(b), then light of a second (weaker) signal propagating in a backward direction experiences a greater transmission loss through the filter than that experienced in a forward direction.

This effect is illustrated in FIG. 23(a). FIG. 23(b) is a graph of isolation (forward/backward rejection) against input power.

External Cavity Laser

Embodiments of an external cavity laser using the type of filter techniques described above will now be described with reference to FIGS. 24 to 28.

Figure 24:
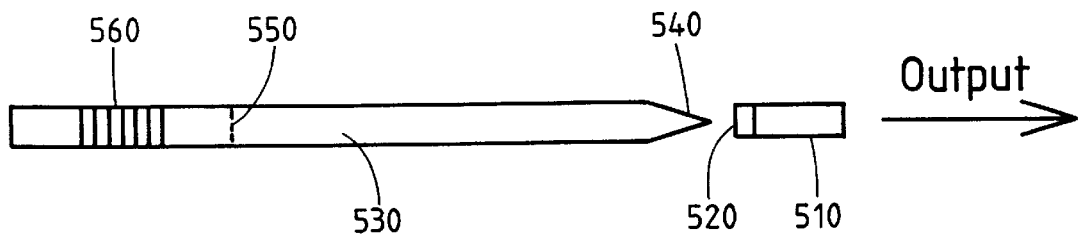
FIG. 24 is a schematic diagram of an optical fibre external cavity laser.

The basic laser configuration of this embodiment is shown in FIG. 24. In this example, a 1530 nm (nanometer) wavelength laser diode 510 has an anti-reflection coated (AR) facet 520 facing an erbium-doped optical fibre 530 forming an external cavity. The fibre end 540 is tapered and tensed to couple directly to the diode 510. The other end 550 of the fibre 530 is spliced to a fibre photorefractive Bragg grating 560, which forms the end reflector of the external cavity.

The Bragg grating 560 is 80% reflecting at 1535 nm, and has a bandwidth of 0.2 nm. The length of the fibre external cavity is 3 m (meters), and so the EC mode spacing is just 30 MHz. The fibre has a single pass, small signal absorption of 3 dB (decibels). The reflection band of the Bragg grating 560 falls within the saturable absorption band of the fibre 530.

The Bragg reflector 560 thus does not discriminate between individual EC modes (in fact, there are about 1000 such modes falling within the bandwidth of the reflector), but it does ensure that the lasing wavelength falls within the $Er^{3+}$ absorption band. (In contrast, if a broadband mirror were used as the end reflector instead of the Bragg grating, the lasing wavelength would shift to about 1515 nm to avoid the $Er^{3+}$ absorption).

Figure 25:
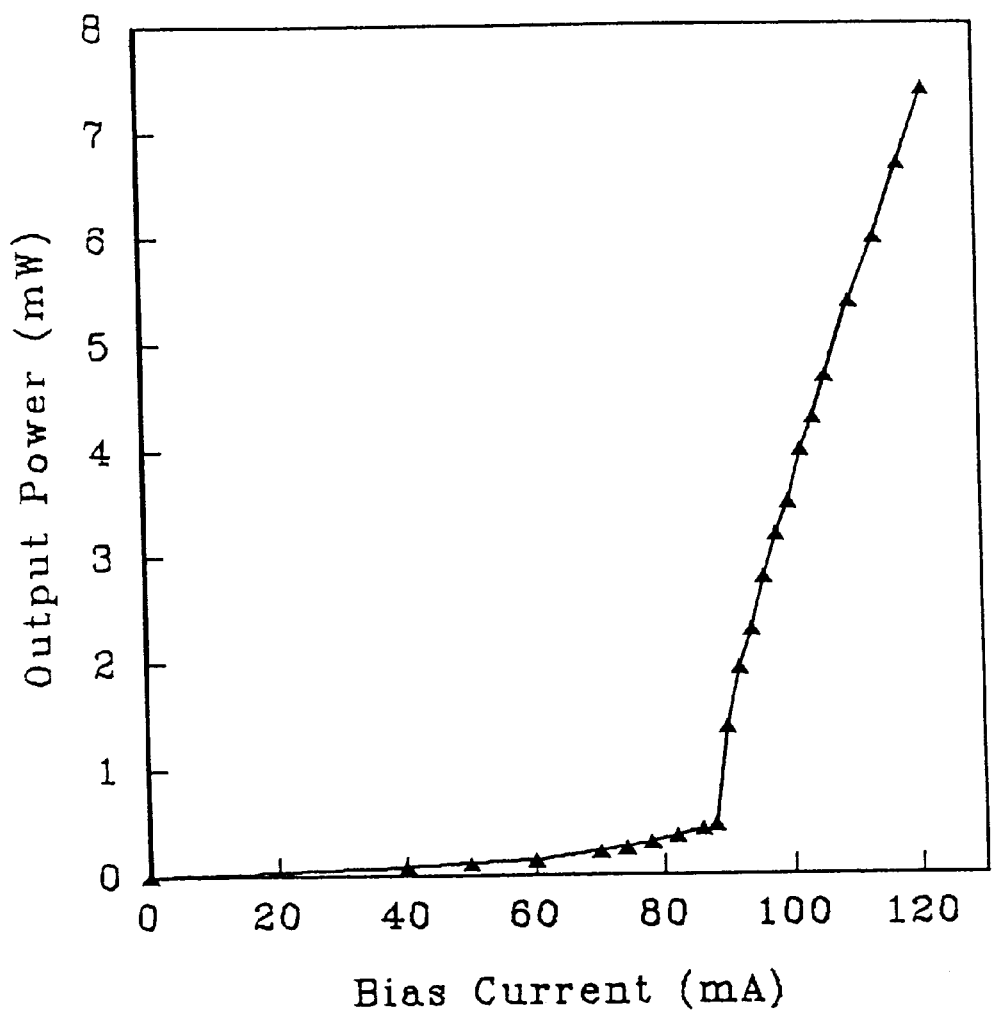
FIG. 25 is a graph of the light-current characteristic of a 3 meter long prototype erbium ($Er^{3+}$) doped fibre external cavity laser.

FIG. 25 shows the light-current characteristic of a prototype laser having a 3 m long cavity as described above. There is a sharp rise in the output power at threshold, which can be attributed to the phenomenon of saturable loss in the $Er^{3+}$-fibre.

Figure 26:
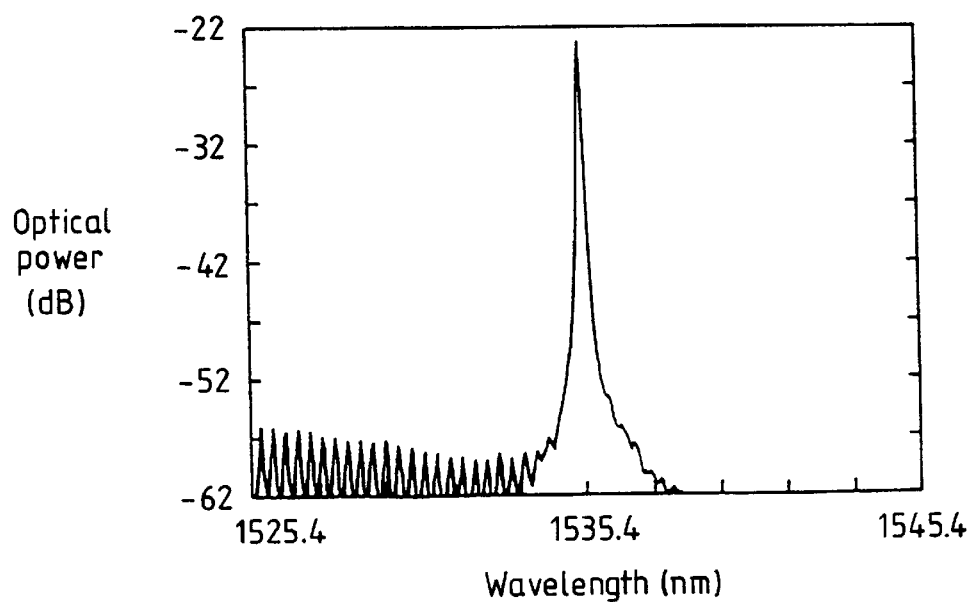
FIG. 26 is a graph illustrating the optical spectrum of the prototype laser at maximum bias.

At maximum bias, the laser output power is 7.5 mW, and the lasing spectrum observed on an optical spectrum analyser with 0.1 nm resolution is shown in FIG. 26, indicating a side mode suppression ratio of about 35 dB. The skilled man will appreciate, however, that such an analyser does not resolve EC modes, and the modes observed here are due to the laser diode alone with its imperfect AR-coating.

To monitor the EC modes, a Newport Supercavity scanning interferometer (FSR=6 GHz, resolution 1 MHz) was used. With routine adjustment of the fibre polarisation state, single frequency operation could be obtained, which was typically stable for tens of minutes without any mode-hops. Instead of mode-hopping, the lasing frequency smoothly drifts back and forth with time, usually over several tens of MHz. (This effect was found to be caused primarily by thermal drifting of the apparatus, which could be addressed using known thermal stabilisation techniques). The laser also remains in the same EC mode as the bias current was varied from maximum to threshold, again without a mode-hop.

Figure 27:
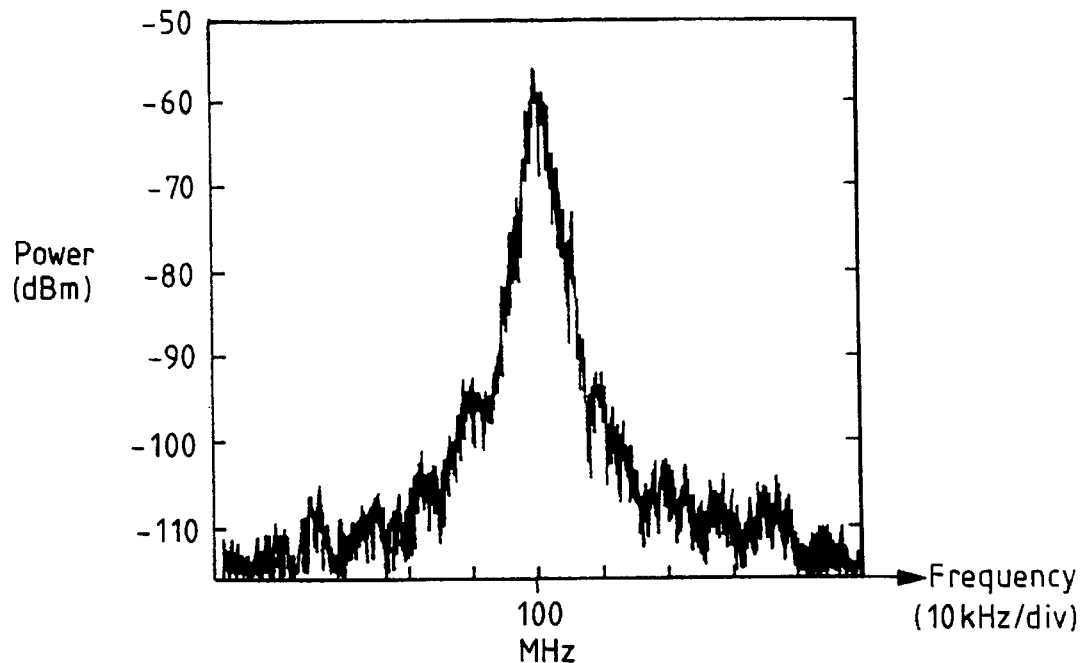
FIG. 27 is a graph illustrating the delayed self-heterodyned beat spectrum of the prototype laser.

The linewidth was measured using a delayed self-heterodyned technique with a 25 km (kilometer) delay line, and the result is shown in FIG. 27.

From the width of the radio frequency (rf) spectrum, an optical linewidth of about 1 kHz (kilohertz) could be inferred. However, since this corresponds to a coherence time longer than the delay time, the laser linewidth detection is thus actually resolution-limited by the measurement set-up, but is likely to be less than one kilohertz.

For these tests, the laser stability is particularly noteworthy since the entire experiment was conducted simply on a small optical bench without vibration isolation, and no significant attempt was made to shield any part of the laser cavity from air currents, etc.

By comparison, when the $Er^{3+}$-fibre was replaced by an equivalent length (3 m) of undoped standard telecommunications fibre, stability was found to be poor, with single mode operation typically lasting only for a few seconds at most before rapid mode-hopping occurred amongst several adjacent EC modes.

The physical basis behind the stabilising effect of the $Er^{3+}$-fibre cavity can be simply accounted for as follows. When single frequency operation is established in the laser, the resulting intensity standing wave formed in the cavity imposes a spatial hole-burning pattern on both the $Er^{3+}$-fibre (loss saturation) and the laser diode (gain saturation). Thus, within the $Er^{3+}$-fibre, regions of high optical intensity coincide with regions of low (saturated) loss, and vice versa. This effect is discussed above.

Within the laser gain medium, similar behaviour would be expected, with regions of high optical intensity coinciding with lower (saturated) gain. However, because the gain region is extremely short relative to the entire cavity, and the external cavity is placed at the end reflector, neighbouring EC modes would all share the standing wave pattern and hence the same spatial gain distribution (at an end reflector, all standing waves terminate as a node). In fact, with the 500 $\mu$m (micrometer) long laser diode, it would require another mode over 0.5 nm away to experience a significantly different gain distribution from the original lasing frequency. If such a mode were able to take advantage of the excess gain, it might destabilise the laser; however, since the bandwidth of the Bragg reflector is 0.2 nm, this is clearly precluded. Furthermore, carrier diffusion would also tend to smooth out the spatial hole-burning pattern in the gain medium (see reference 7 below). The result is that spatial hole burning in the gain medium has very small destabilising effects.

The $Er^{3+}$-fibre, on the other hand, spans practically the entire cavity, and the spatial loss pattern formed will discriminate even against adjacent EC modes, since at some point(s) along the cavity length, the standing wave patterns of different modes will be out of phase with each other. Effectively, a narrow-bandpass filter with bandwidth on the order of an EC mode spacing is burned into the $Er^{3+}$-fibre by the lasing mode, which then serves to reinforce that lasing frequency and suppress other EC modes.

The self-written nature of this filter also allows the lasing frequency to shift smoothly to accommodate slow drifts/perturbations (on time scales longer than the $Er^{3+}$ lifetime of about 10 ms) without having to mode-hop, as has been observed, which can be useful for tuning the laser.

In the experiments performed using the prototype laser, the laser stability is not necessarily improved with shorter $Er^{3+}$-fibre cavities. This is because the Er3+-based filter bandwidth varies inversely with the length, thus longer lengths yield better frequency selectivity, which compensates for the potentially greater destabilising effects arising from closer EC mode spacings.

In a second prototype laser, the 3m long erbium fibre was replaced by a 17 cm (centimeter) length of a higher concentration $Er^{3+}$-fibre with a small signal absorption loss of 2.2 dB. The total fibre cavity length was then 0.43 m as there was a 25 cm section of undoped fibre attached to the Bragg grating.

In this experiment, the laser could also operate stably for tens of minutes without mode-hopping, but the lasing frequency tended to drift over a wider range (several hundreds of MHz). This could be directly due to perturbations associated with the laser diode having a greater impact, (possibly through gain/index fluctuations or shifts in the diode-fibre coupling since the fibre lens tip is simply held in free space) since the diode constitutes a larger fraction of the entire cavity.

Accordingly, longer $Er^{3+}$-fibre cavities would thus seem more advantageous in reducing medium term frequency drift.

Figure 28:
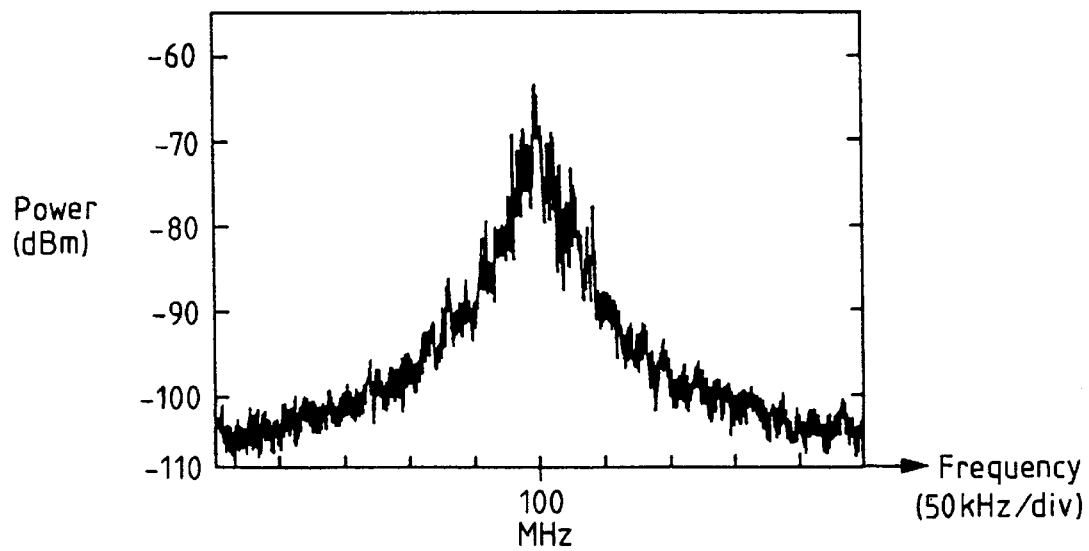
FIG. 28 is a graph illustrating the delayed self-heterodyned beat spectrum of a second prototype 0.43 meter long external cavity laser with a 17 cm length $Er^{3+}$-fibre.

For the shorter (43 cm) cavity, the laser linewidth measurement is shown in FIG. 28. Assuming a Lorentzian profile, the optical linewidth is deduced to be 8 kHz from the −20 dB rf spectrum width of 150 kHz. Indeed, if this broader, and hence more reliably measurable, linewidth is used to estimate the corresponding linewidth for a 3 m cavity based on the established dependence of linewidth on 1/(cavity length)$^2$ (see reference 1 below), a linewidth in the region of 200 Hz is derived for the 3 m cavity laser. This supports the earlier assertion that the linewidth was actually sub-kHz for the 3 m long prototype EC laser which was constructed and tested.

As a comparison, the 17 cm length of $Er^{3+}$-fibre was replaced with an equal length of undoped fibre, thus forming a conventional 0.4 m fibre external cavity laser. Single mode stability was still poor with this shorter cavity. Closer examination showed that single mode operation was invariably upset whenever the mode drifted by about 200 MHz (the EC spacing for this laser) usually resulting in a mode-hop back to the previous EC mode. This is in contrast to the prototype $Er^{3+}$-fibre EC laser, which can maintain uninterrupted single frequency operation in spite of frequency drifts over several mode spacings, another indication of the increased robustness achievable with this external cavity configuration.

In conclusion, the tests performed on the prototype lasers demonstrate that an erbium fibre based external cavity semiconductor laser represents a significant improvement over conventional undoped fibre external cavity lasers. The self-stabilising effects of spatial hole burning in the $Er^{3+}$-fibre allows long cavities to be constructed without incurring severe penalties in single mode stability, thus enabling very narrow linewidths to be easily achieved. Together with the well-known advantages of fibre Bragg gratings which can be fabricated to close wavelength tolerances, this technique offers attractive prospects for realising large numbers of stable compact single frequency lasers at specific wavelengths for wavelength division multiplexing (WDM) applications.

The embodiment described above uses a semiconductor diode 10 as a lasing element. However, the techniques described are equally applicable to schemes using a series structure of a planar waveguide laser and a saturable absorbing fibre external cavity, or a composite series semiconductor structure on a single substrate of a laser diode and a suitable non-lasing saturable absorber. Also, other types of waveguide (e.g. planar waveguides) could be used instead of optical fibres.

PUBLICATION REFERENCES

1. Henry, J. Lightwave Technol., LT-4, 288 (1986).
2. Brinkmeyer et al, Electron. Lett., 22, 135 (1986).
3. Liou et al, Appl. Phys. Lett., 48, 1039 (1986).
4. Whallen et al, Electron. Lett., 23, 313 (1987).
5. Bird et al, Electron. Lett., 27, 1115 (1991).
6. Morton et al, Appl. Phys. Lett., 64, 2634 (1994).
7. Statz et al, J. Appl. Phys., 35, 2581 (1964).

We claim:

1. An optical filter for filtering a first optical signal from a second optical signal, the first and second optical signals having different wavelengths and intensities, the filter comprising:

a multi-core saturable optical absorbing fibre having a plurality of cores, the first and second signals being launched into a subset of the plurality of cores, the first signal intensity causing a greater saturation of the absorber than the second signal intensity;

the arrangement being such that, in operation, the first optical signal and the second optical signal propagate in the optical fibre to form respective spatial intensity distributions dependent on the wavelength of each signal.

2. A filter according to claim 1, in which the optical fibre is terminated at one end by an optical reflector, whereby at least a portion of light propagating along the optical fibre towards the reflector is reflected back along the optical fibre in a direction away from the reflector.

3. A filter according to claim 2, in which the length of the optical fibre is between about 100 and about 10000 times the wavelength of the first signal in the optical fibre.

4. A filter according to claim 2, comprising a portion of substantially non-saturable absorbing optical fibre adjacent to the reflector connected to a portion of saturable absorbing optical fibre.

5. A filter according to claim 2, in which the optical reflector is a mirror.

6. A filter according claim 2, in which the optical reflector is a Bragg reflector.

7. A filter according to claim 2, comprising an optical circulator, connected to an end of the optical fibre opposite to the reflector, the optical circulator having at least:
   a first port for receiving the first and second optical signals;
   a second port connected to the optical fibre for transmitting light received at the first port to the optical fibre and for receiving light from the optical fibre; and
   a third port for supplying light received at the second port as an output signal.

8. A filter according to claim 2, comprising an optical fibre coupler, the optical fibre coupler having at least:
   a first port for receiving the first and second optical signals;
   a second port connected to the optical fibre for transmitting at least a portion of light received at the first port to the optical fibre and for receiving light from the optical fibre; and
   a third port for supplying at least a portion of light received at the second port as an output signal.

9. A filter according to claim 8, in which the coupler is a substantially 50:50 coupler.

10. A filter according to claim 8, in which the coupler has at least a fourth port connected to a second optical fibre for transmitting at least a portion of light received at the first port to the second optical fibre and for receiving light from the optical fibre; and in which the third port is operable to supply at least a portion of light received at the fourth port as an output signal.

11. A filter according to claim 2, in which the optical fibre is a single mode optical fibre.

12. A filter according to claim 11, in which the optical fibre is a gallium-lanthanum-sulphur optical fibre.

13. A filter according to claim 1, in which the optical fibre is doped with a rare earth dopant.

14. A filter according to claim 13, in which the optical fibre is doped with erbium.

15. A filter according to claim 13, in which the optical fibre is doped with praseodymium.

16. A filter according to claim 13, in which the dopant has a concentration of between about $10^{22}$ and about $10^{26}$ ions per cubic meter.

17. A filter according to claim 1, comprising means for combining light propagating in the plurality of cores of the optical fibre to generate an output optical signal.

18. A filter according to claim 17, in which the combining means comprises a tapered portion of the optical fibre.

19. A filter according to claim 1, in which the optical fibre is a dual-core optical fibre having two cores.

20. A filter according to claim 1, in which the optical fibre is a triple-core optical fibre having three cores axially disposed side-by-side in a row.

21. A filter according to claim 1, in which the length of the optical fibre is between about 100 and about 10000 times a cross-coupling beat length of the first signal.

22. Optical filtering apparatus for filtering a first optical signal from a second optical signal, the first and second optical signals having different wavelengths and intensities, the optical filtering apparatus comprising:
   an optical limiting amplifier for amplifying the first and second optical signals; a filter according to claim 1 for filtering the amplified first optical signal and the amplified second optical signal, the amplified first optical signal causing greater saturation of the absorber than the amplified second optical signal.

23. Optical filtering apparatus for filtering a first optical signal from a second optical signal, the optical filtering apparatus comprising a filter according to claim 1 connected in series with a broadband fixed optical filter.

24. An optical filter for filtering a first optical signal from a second optical signal, the first and second optical signals having different wavelengths and intensities, the filter comprising:
   an optical fibre filter element terminated at one end by an optical reflector, whereby at least a portion of light propagating along the filter element towards the reflector is reflected back along the filter element in a direction away from the reflector, the filter element comprising a portion of substantially non-saturable absorbing optical fibre adjacent to the reflector connected to a portion of saturable absorbing optical fibre, the first signal intensity causing a greater saturation of the saturable absorbing fibre than the second signal intensity;
   the arrangement being such that, in operation, the first optical signal and the second optical signal propagate in the filter element to form respective spatial intensity distributions dependent on the wavelength of each signal.

25. A method of optically filtering a first optical signal from a second optical signal, the first and second optical signals having different wavelengths and intensities, the method comprising the steps of:
   directing the first optical signal and the second optical signal into a subset of cores of a saturable multi-core optical fibre absorber, the first signal intensity causing a greater saturation of the absorber than the second signal intensity; such that the first optical signal and the second optical signal propagate in the absorber to form respective spatial intensity distributions dependent on the wavelength of each signal.

* * * * *